US007318697B2

United States Patent
Wu et al.

(10) Patent No.: US 7,318,697 B2
(45) Date of Patent: Jan. 15, 2008

(54) UNIVERSAL RETICLE TRANSFER SYSTEM

(75) Inventors: Kung Chris Wu, Sunnyvale, CA (US);
Robert Frank Sifuentes, Milpitas, CA (US); Kenneth Alan Hardy, San Jose, CA (US); Edgardo A. Caliboso, Sunnyvale, CA (US); Anatoly Malobrodsky, Mountain View, CA (US); Chien-Rong Huang, Hsin Chu (TW)

(73) Assignee: Fortrend Engineering Corporation, Sunnyvale, CA (US)

( * ) Notice: Subject to any disclaimer, the term of this patent is extended or adjusted under 35 U.S.C. 154(b) by 333 days.

(21) Appl. No.: 10/506,861

(22) PCT Filed: Jun. 12, 2003

(86) PCT No.: PCT/US03/18705

§ 371 (c)(1),
(2), (4) Date: Sep. 2, 2004

(87) PCT Pub. No.: WO03/106310

PCT Pub. Date: Dec. 24, 2003

(65) Prior Publication Data
US 2006/0177287 A1 Aug. 10, 2006

(51) Int. Cl.
*H01J 5/02* (2006.01)
(52) U.S. Cl. .................... 414/412; 414/217; 414/419; 414/397
(58) Field of Classification Search ............ 414/217, 414/222.17, 226.04, 744.8, 770, 937, 403, 414/412, 416.08, 419
See application file for complete search history.

(56) References Cited
U.S. PATENT DOCUMENTS
5,097,421 A    3/1992   Maney et al.
5,225,691 A *  7/1993   Powers et al. ........... 250/559.4

(Continued)

FOREIGN PATENT DOCUMENTS
JP    06013453 A    1/1994
JP    411165866 A   6/1999

OTHER PUBLICATIONS

Specification for 300-mm Bottom-Opening Standard Mechanical Interface (SMIF), SEMI19.5-0996, © SEMI 1978, 1996.

(Continued)

*Primary Examiner*—Charles A Fox
(74) *Attorney, Agent, or Firm*—Donald E. Schreiber

(57) ABSTRACT

A specially adapted SMIF pod (20) receives and holds one particular type of reticle cassette (36) or reticle holder (132) selected from among dozens of different configurations thereof. The SMIF pod (20) may be interrogated to determine the particular type of reticle cassette (36) or reticle holder (132) carried therein. A reticle transfer system (50) receives a pair of such SMIF pods (20), interrogates each of the SMIF pods (20) to ascertain which type of reticle cassette (36) or reticle holder (132) the SMIF pod (20) carries, and automatically moves reticles (42) through a controlled environment from one reticle cassette (36) or reticle holder (32) to another reticle cassette (36) or reticle holder (132). A reticle reorienter (56) includable in the system (50) also permits automatically exchanging reticles (42) between a reticle carrier (144) and a reticle cassette (36) or reticle holder (132).

26 Claims, 20 Drawing Sheets

U.S. PATENT DOCUMENTS

| | | | |
|---|---|---|---|
| 5,409,348 A | 4/1995 | Suzuki | |
| 5,674,039 A | 10/1997 | Walker et al. | |
| 5,695,562 A | 12/1997 | Mizosaki | |
| 5,915,910 A | 6/1999 | Howells et al. | |
| 5,972,727 A | 10/1999 | Ryan et al. | |
| 6,152,680 A | 11/2000 | Howells et al. | |
| 6,188,323 B1* | 2/2001 | Rosenquist et al. | 340/686.5 |
| 6,409,448 B1 | 6/2002 | Sindledecker | |
| 6,427,096 B1 | 7/2002 | Lewis et al. | |
| 6,612,590 B2* | 9/2003 | Coomer et al. | 279/158 |
| 2002/0064450 A1* | 5/2002 | Coomer et al. | 414/939 |
| 2003/0085582 A1* | 5/2003 | Woodruff et al. | 294/103.1 |

OTHER PUBLICATIONS

Specification for a Reticle SMIF Pod (RSP) Used to Transport and Store 6 Inch or 230 mm Reticles, SEMI E100-0302, © EMI 2000, 2002.

Provisional Mechanical Specification for a 150 mm Reticle SMIF Pod (RSP150) Used to Transport and Store a 6 inch Reticle, SEMI E111-0303, © 2001, 2003.

Provisional Mechanical Specification for a 150 mm Multiple Reticle SMIF Pod (MRSP150) Used to Transport and Store Multiple 6 inch Reticles, SEMI E111-0303, © SEMI 2001, 2003.

* cited by examiner

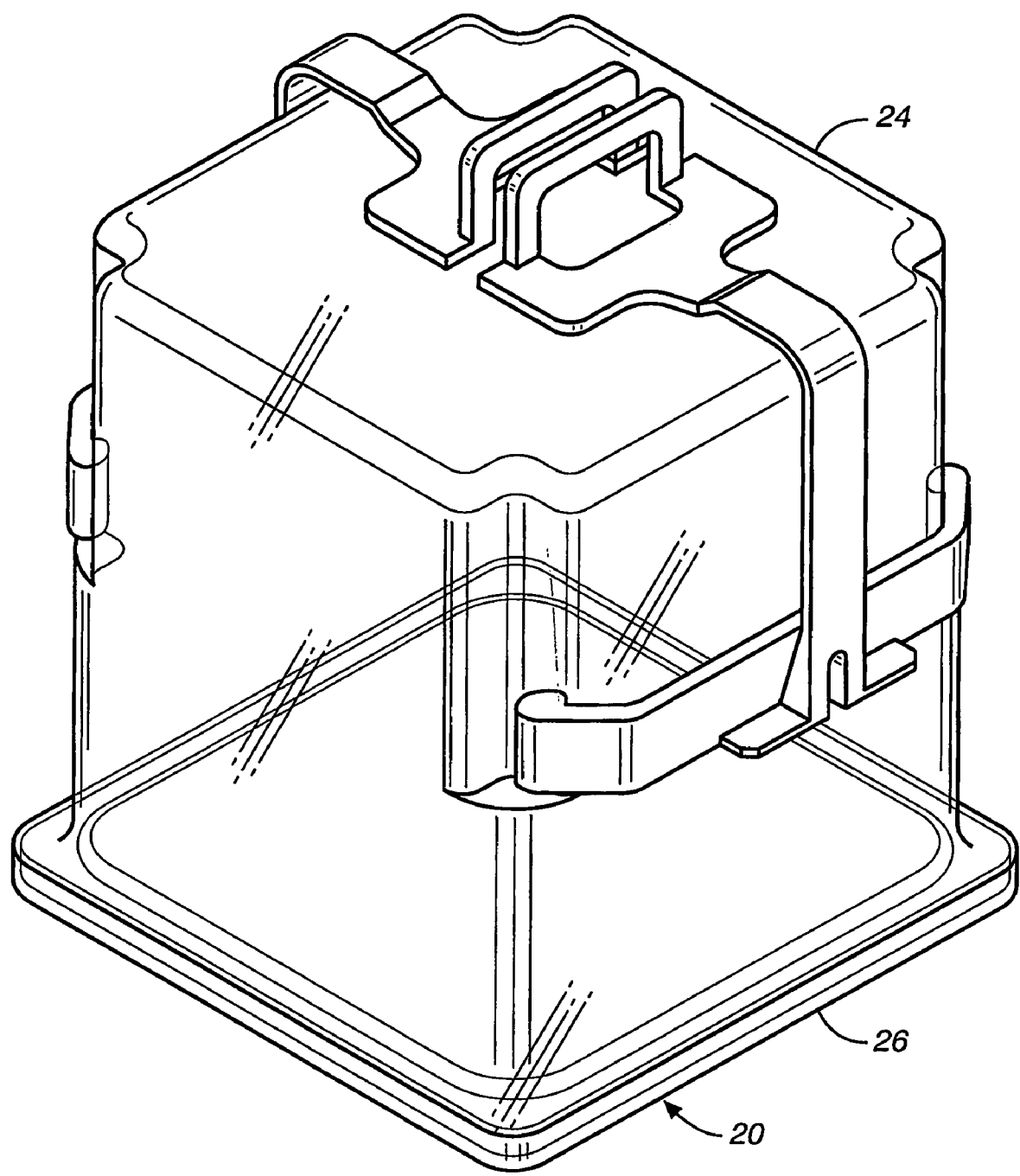
FIG._1

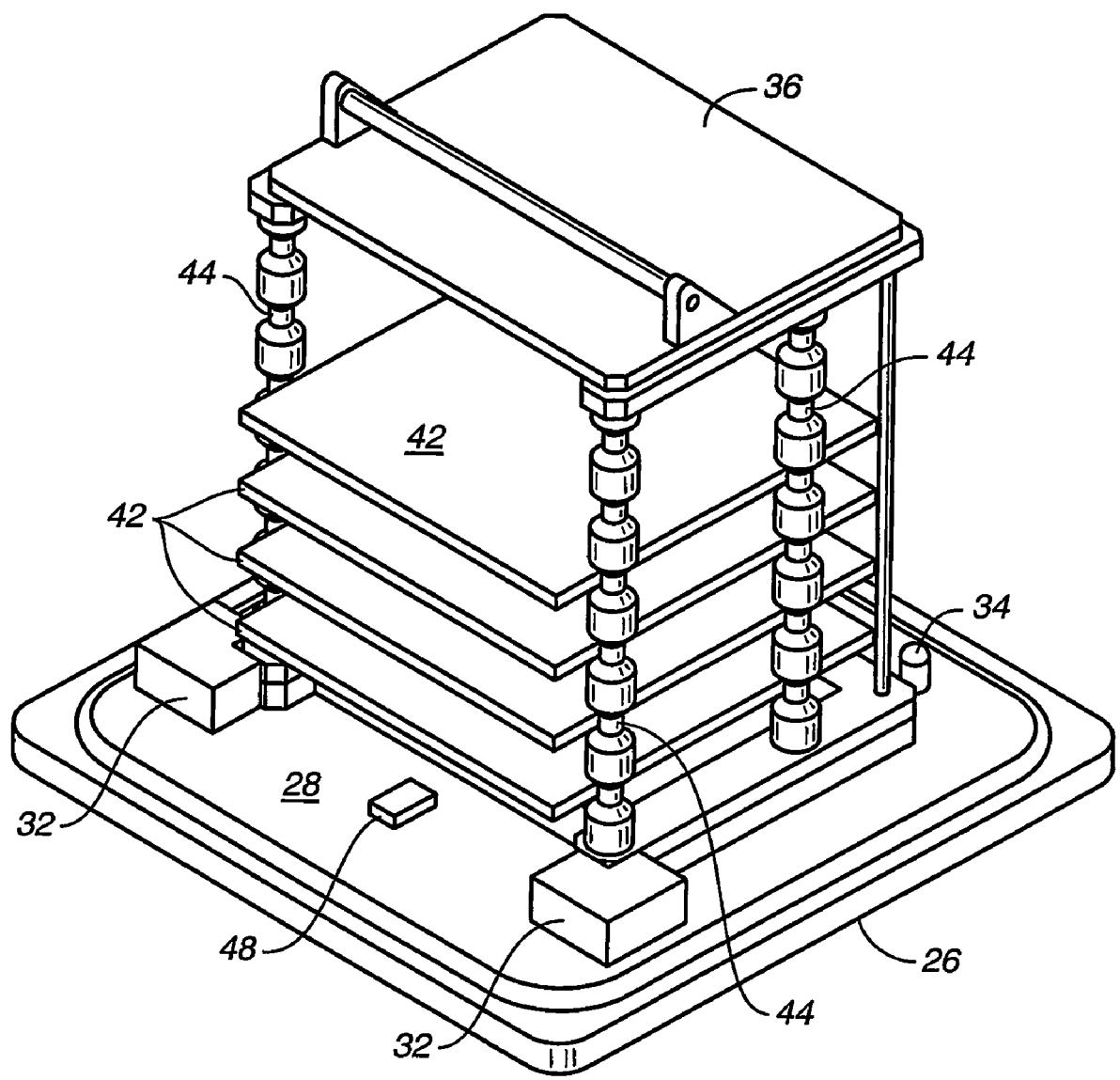
FIG._2

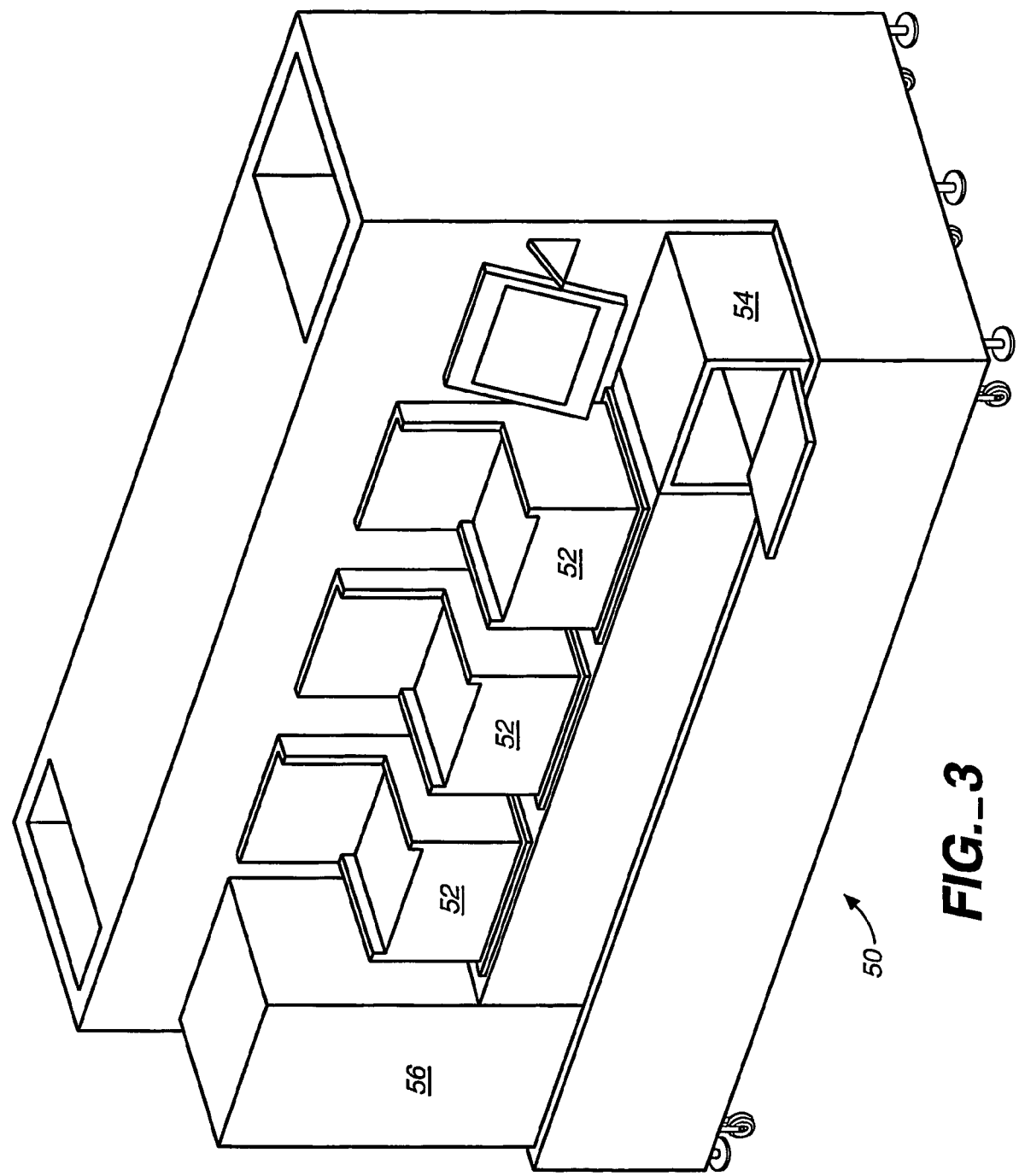
FIG._3

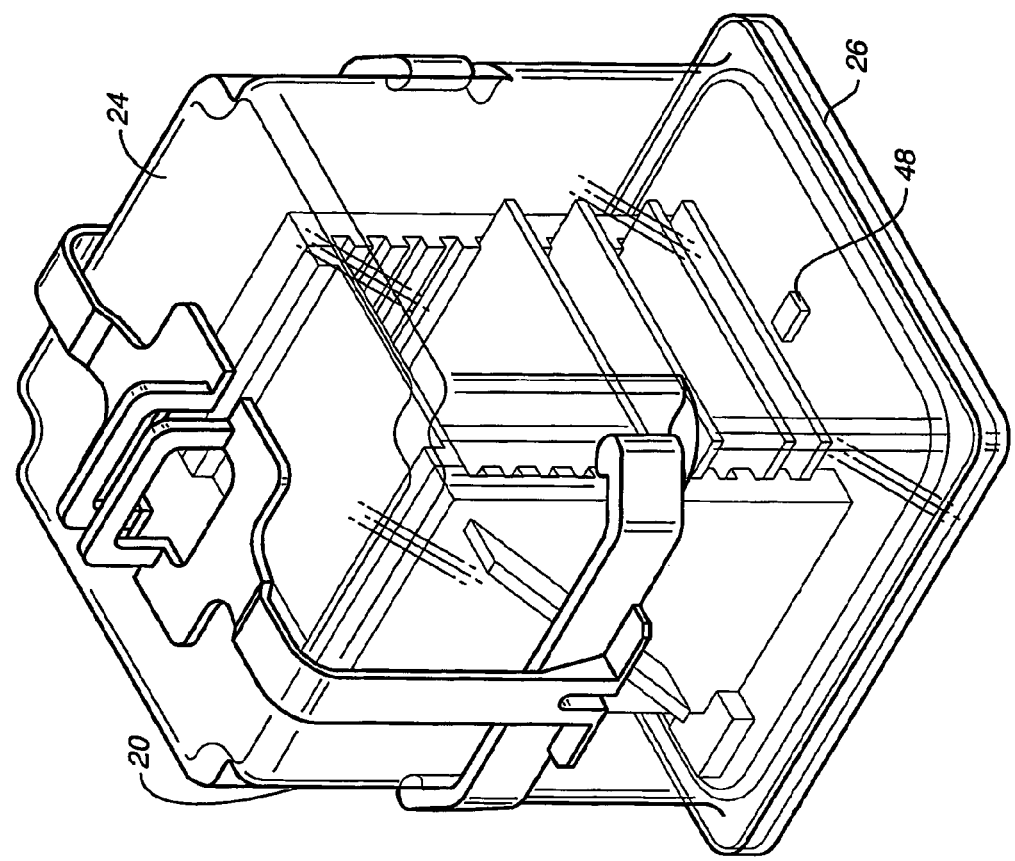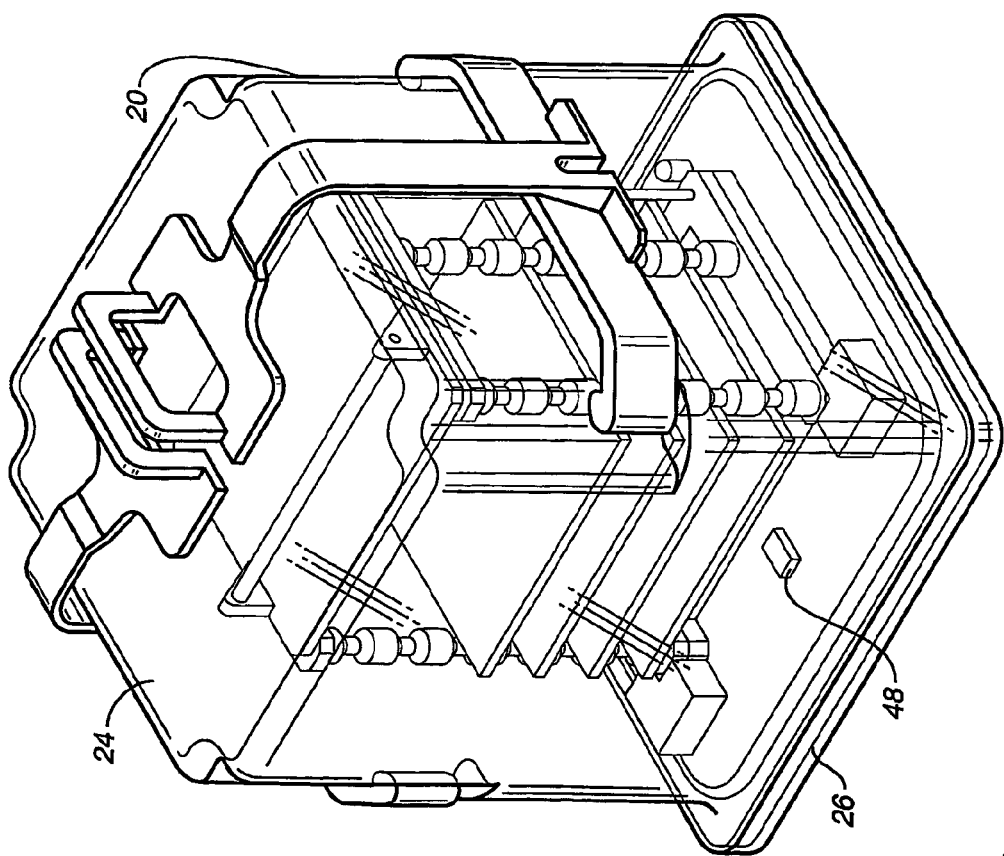
FIG._4

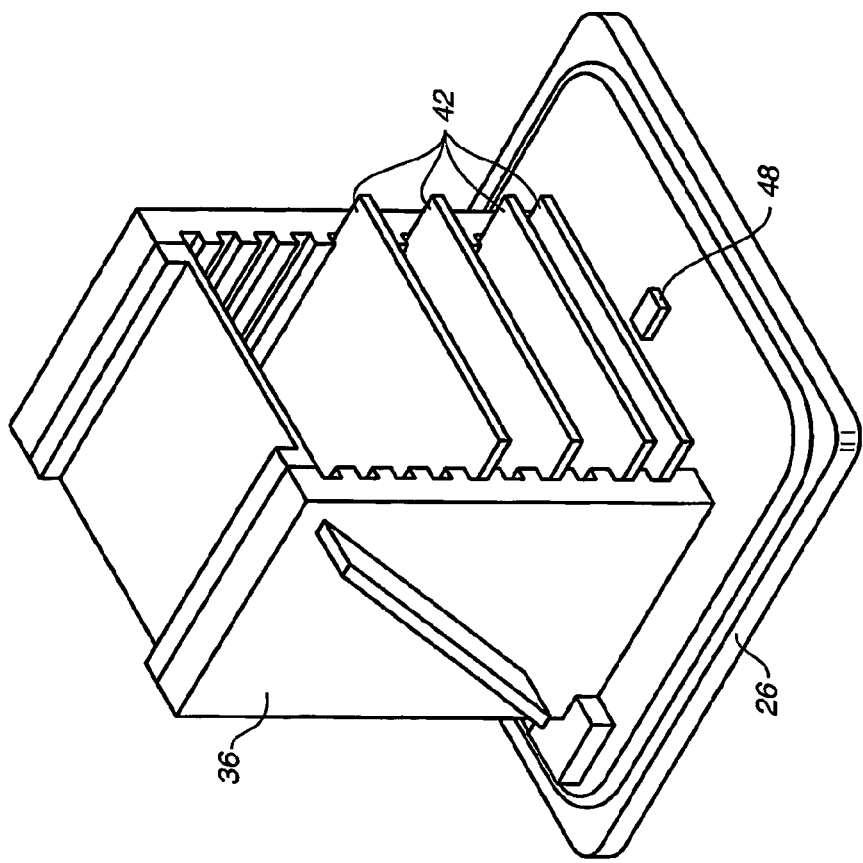
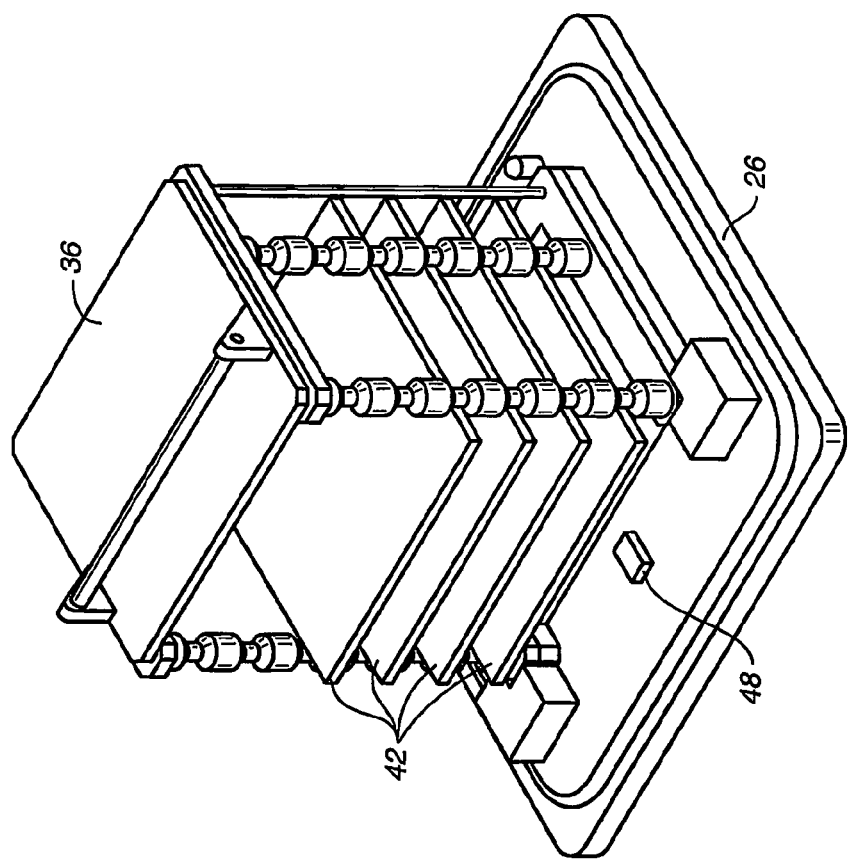
FIG._5

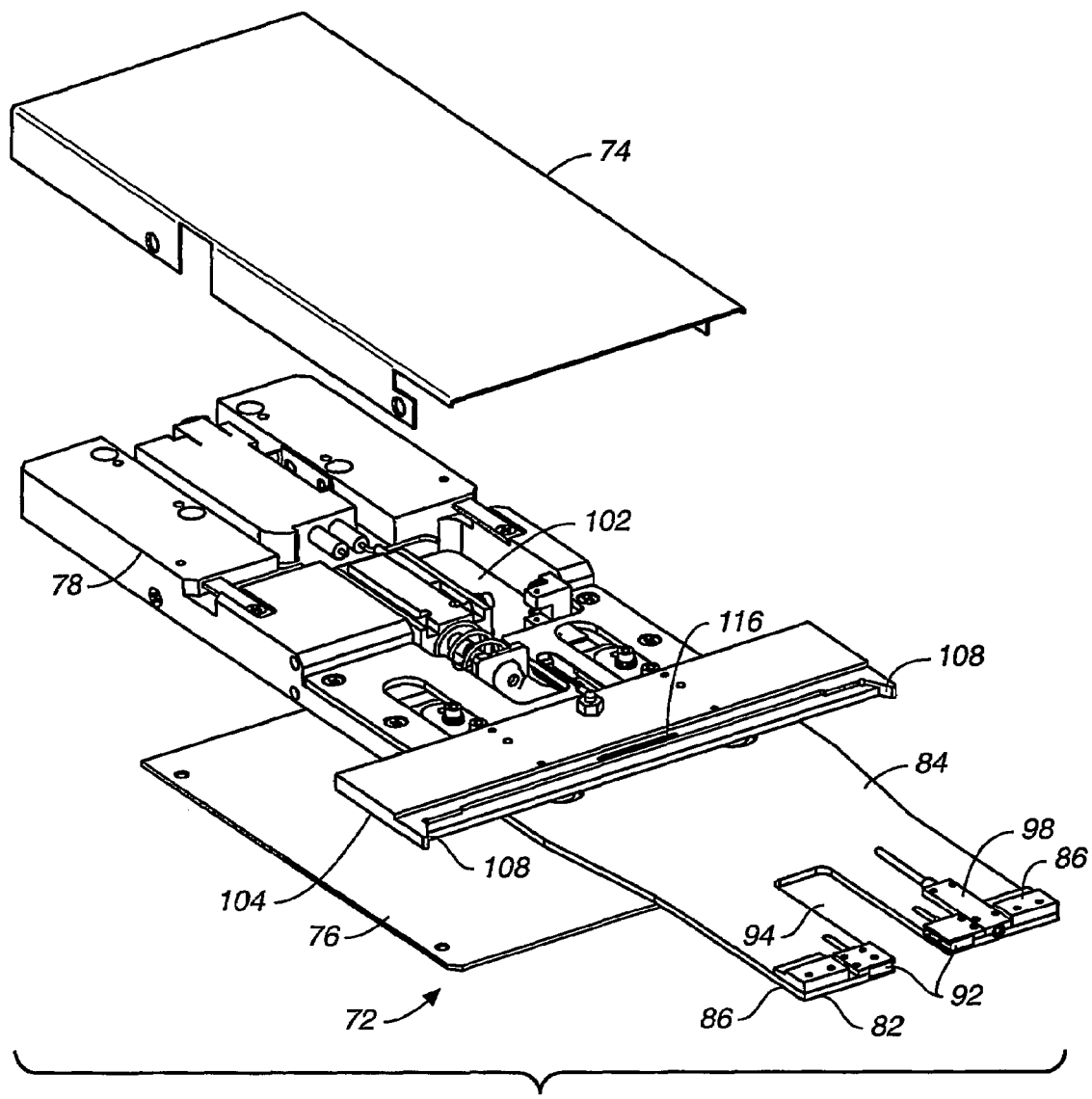
FIG._6

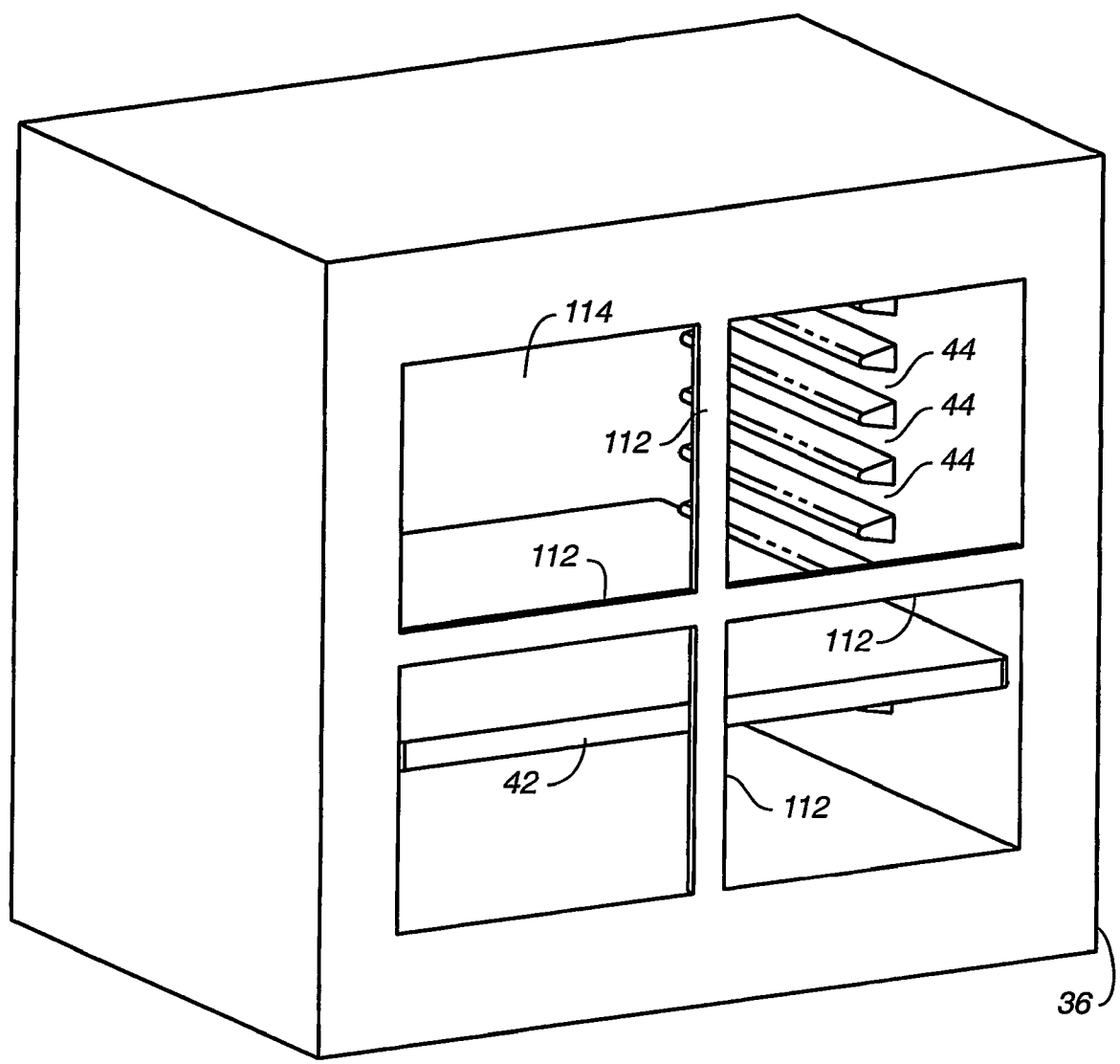
FIG._7

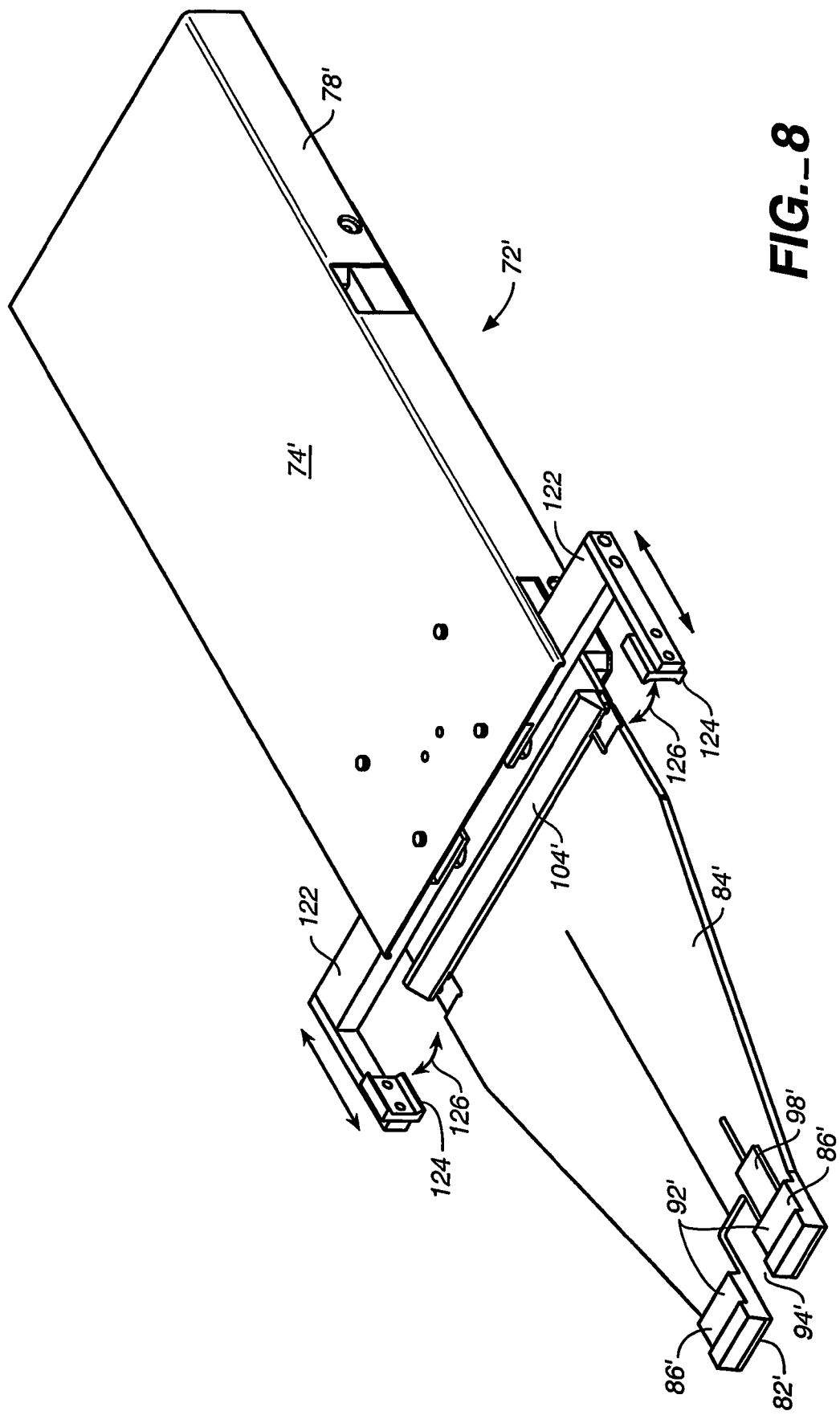
FIG._8

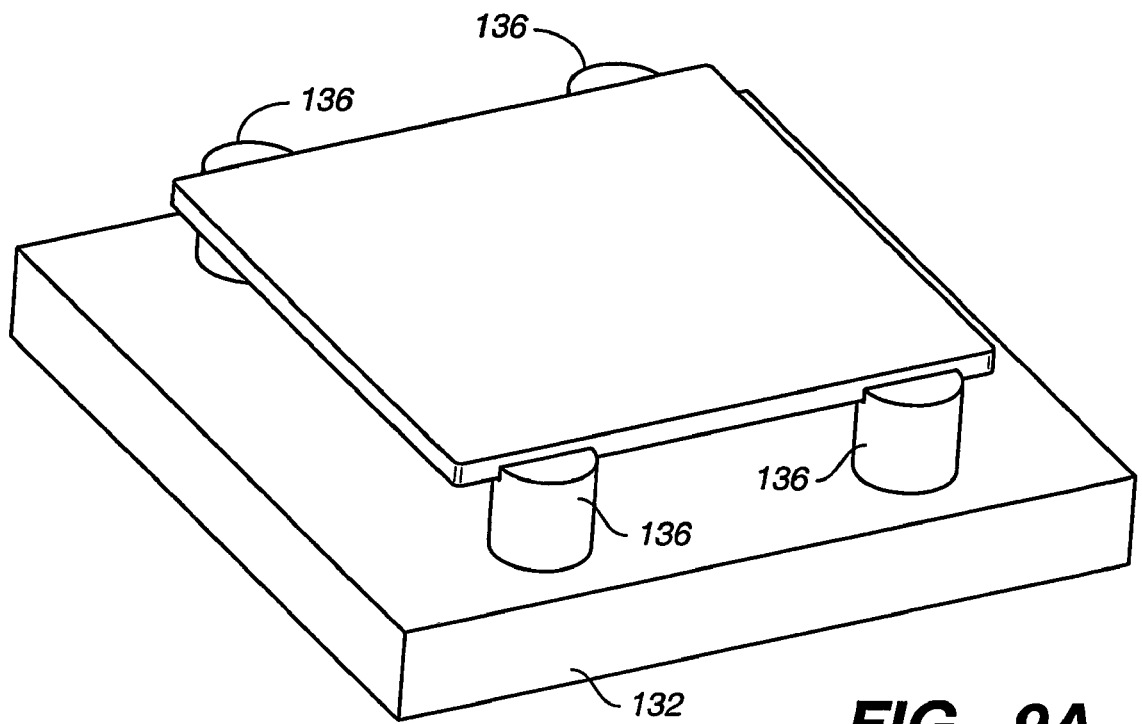
FIG._9A
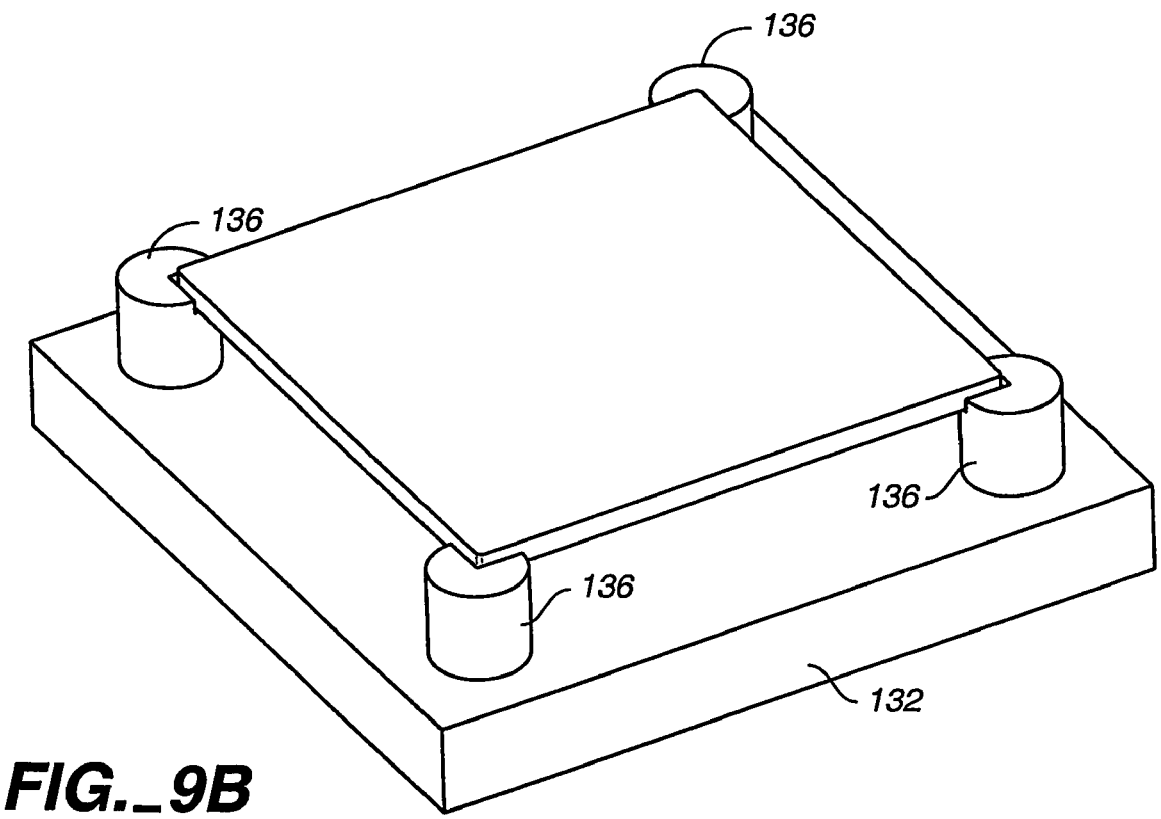
FIG._9B

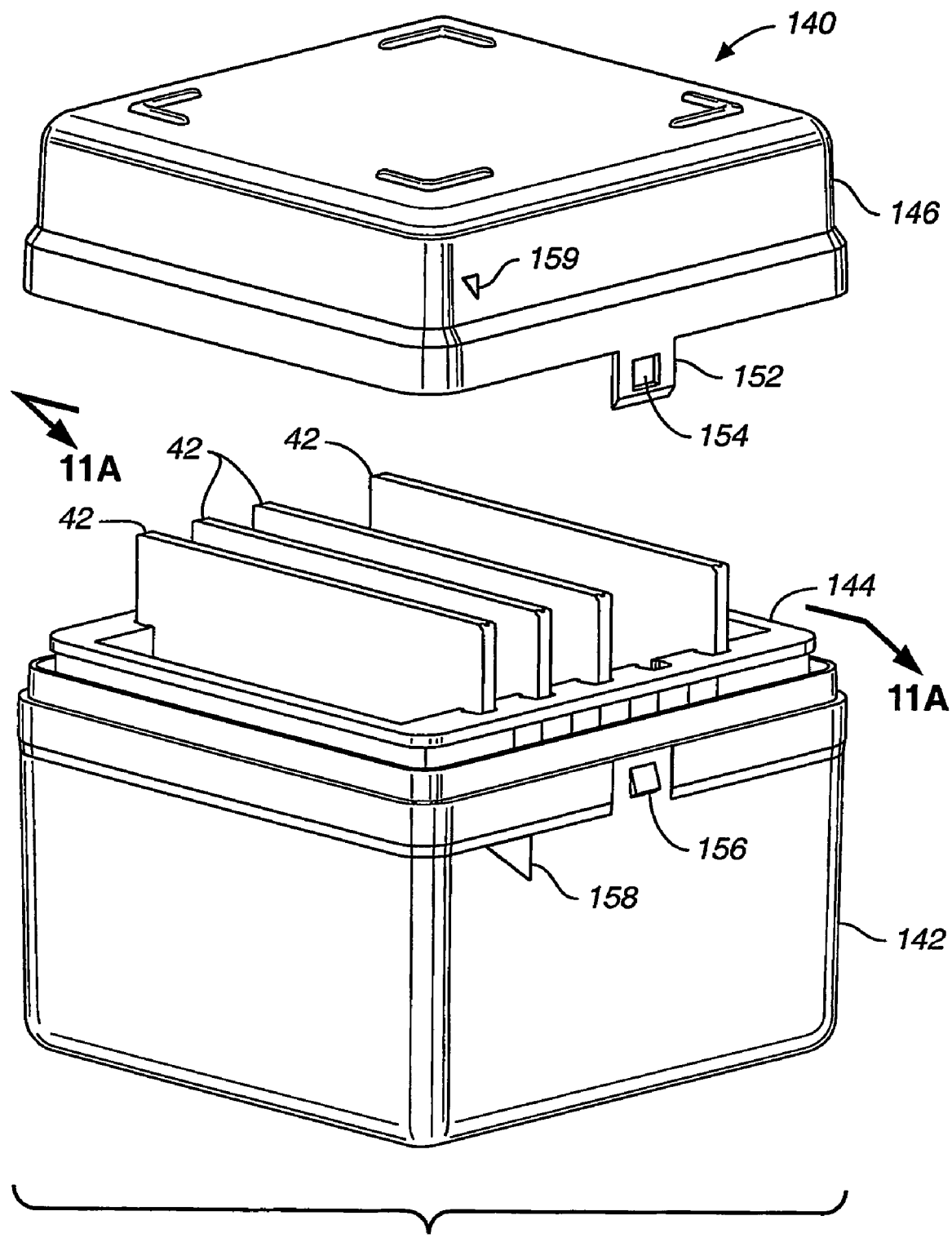
FIG._10

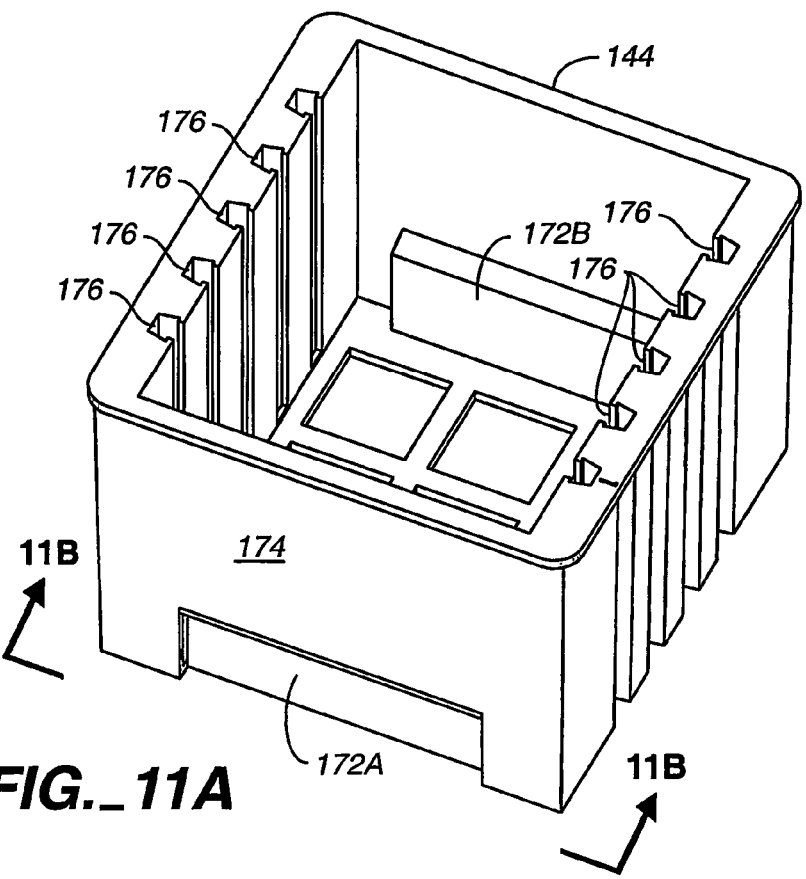
FIG._11A
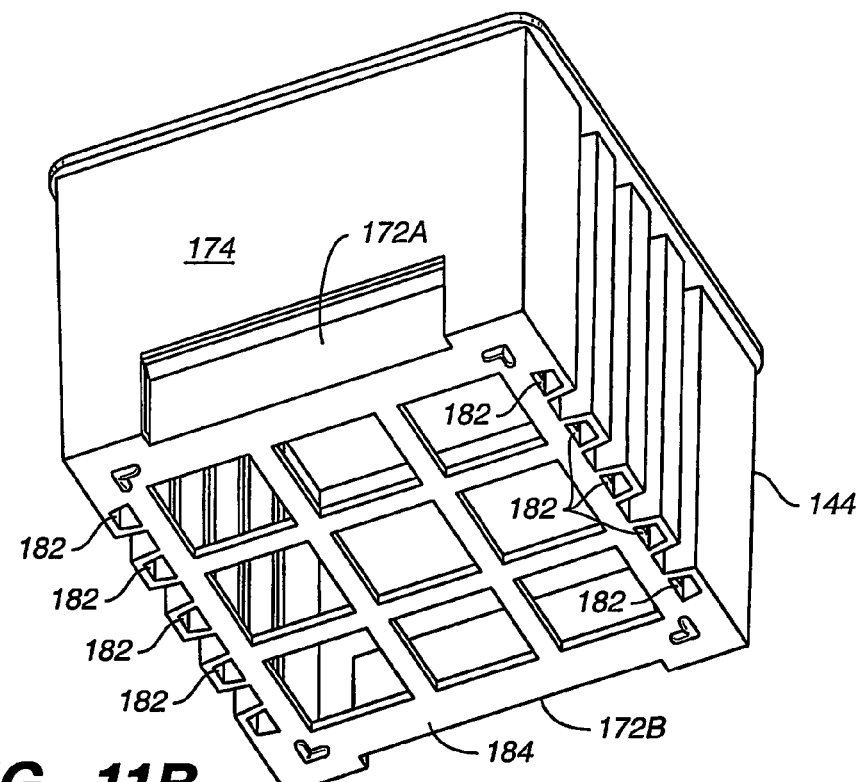
FIG._11B

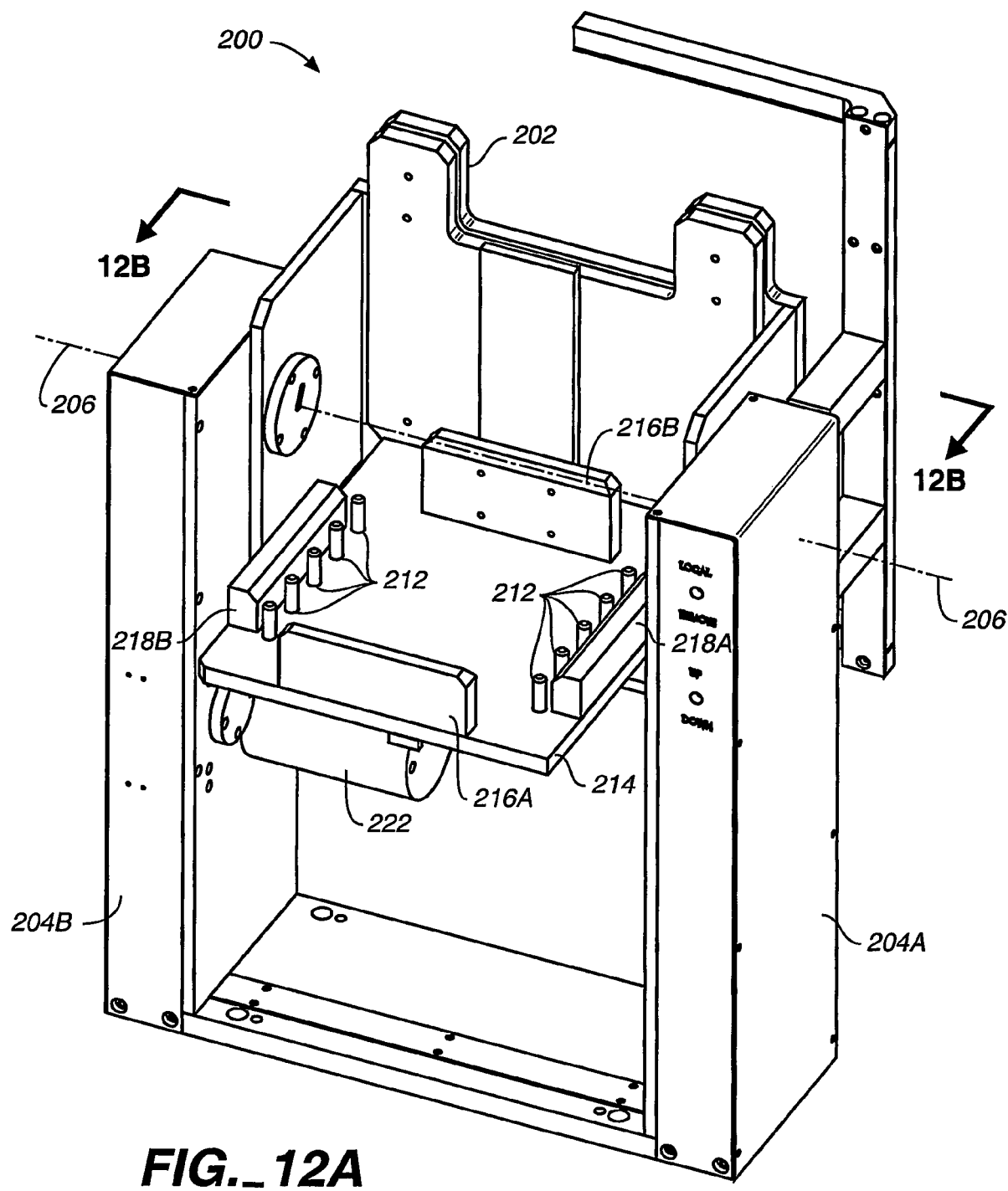
FIG._12A

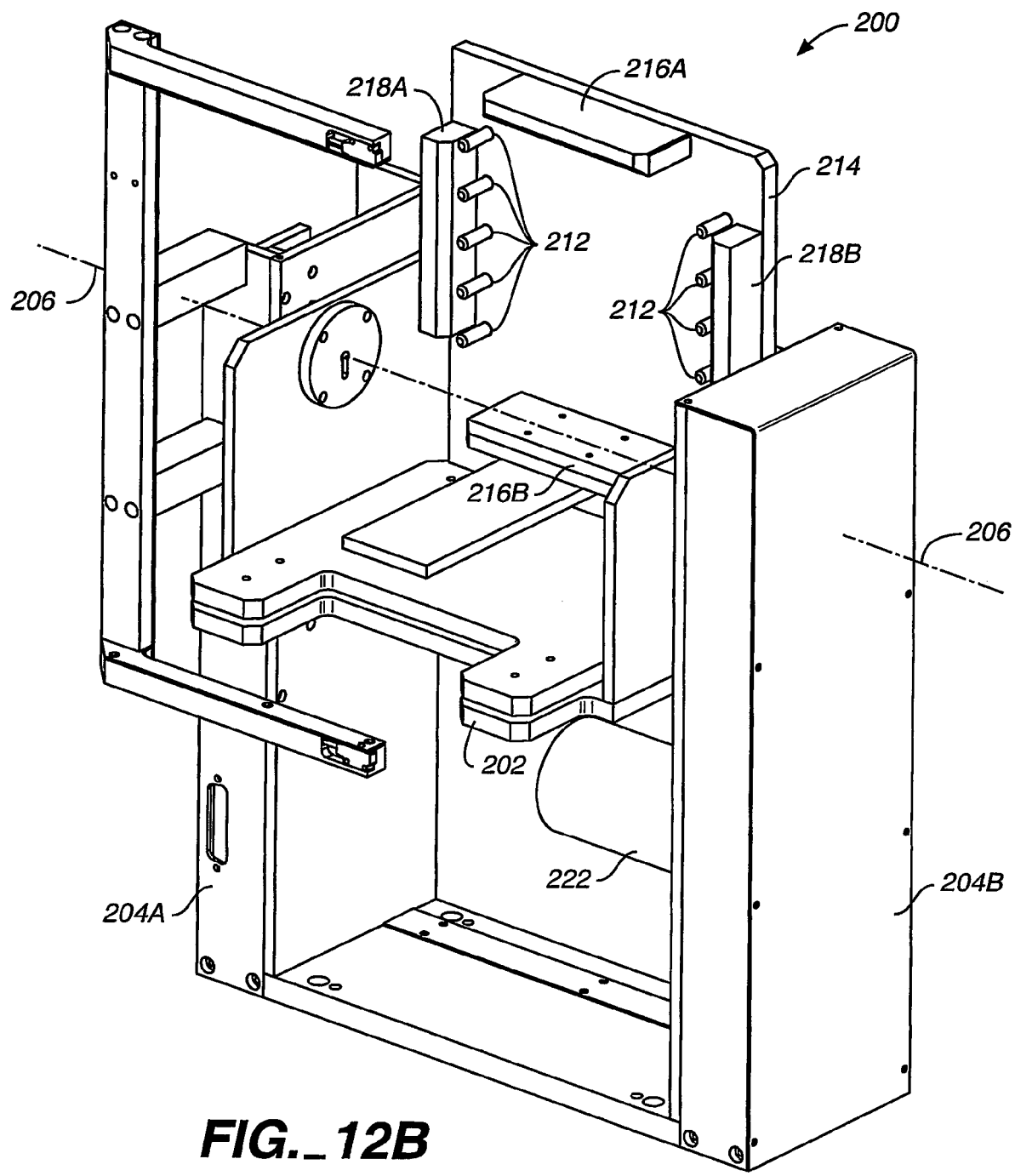
FIG._12B

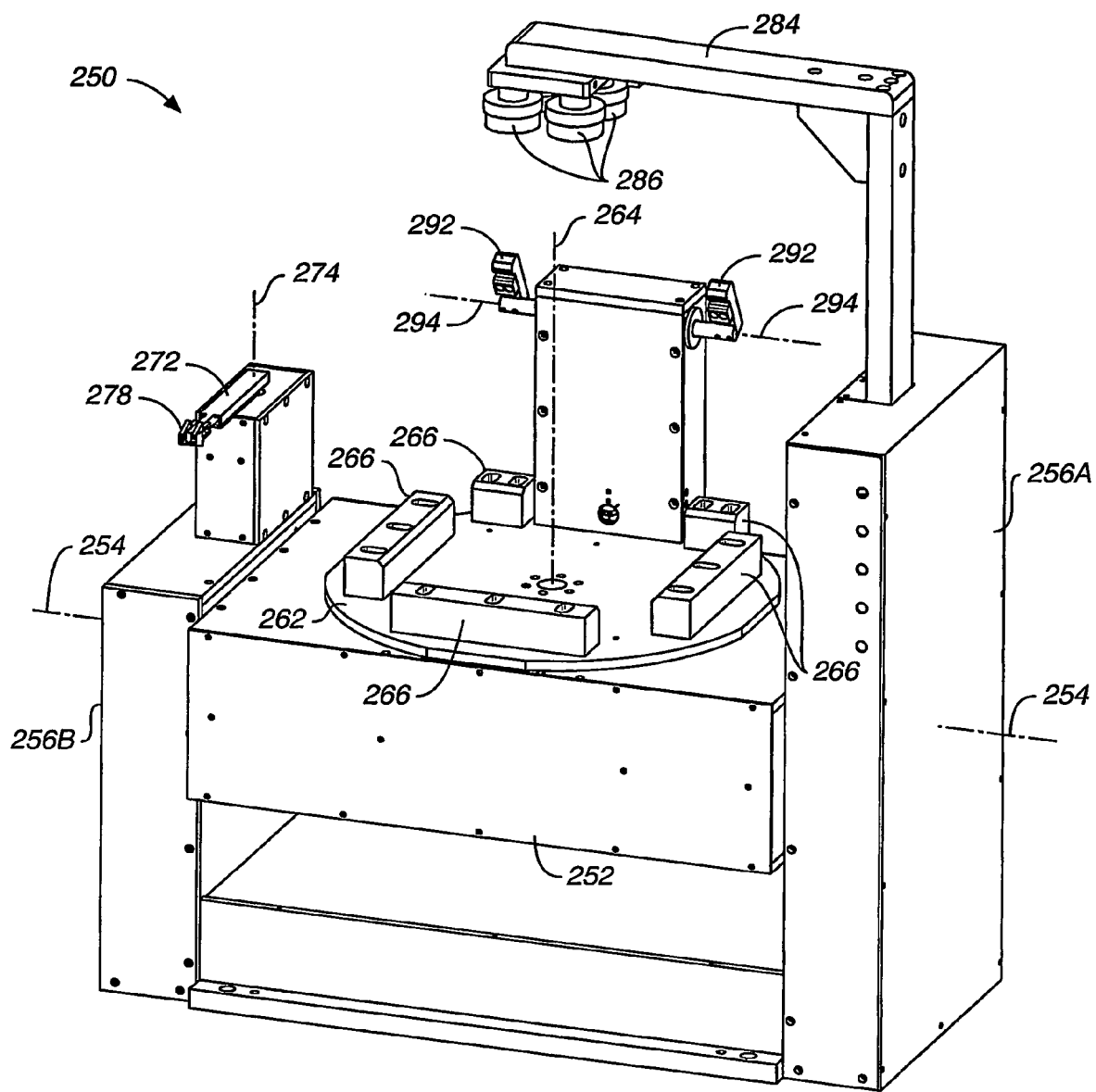
FIG._13

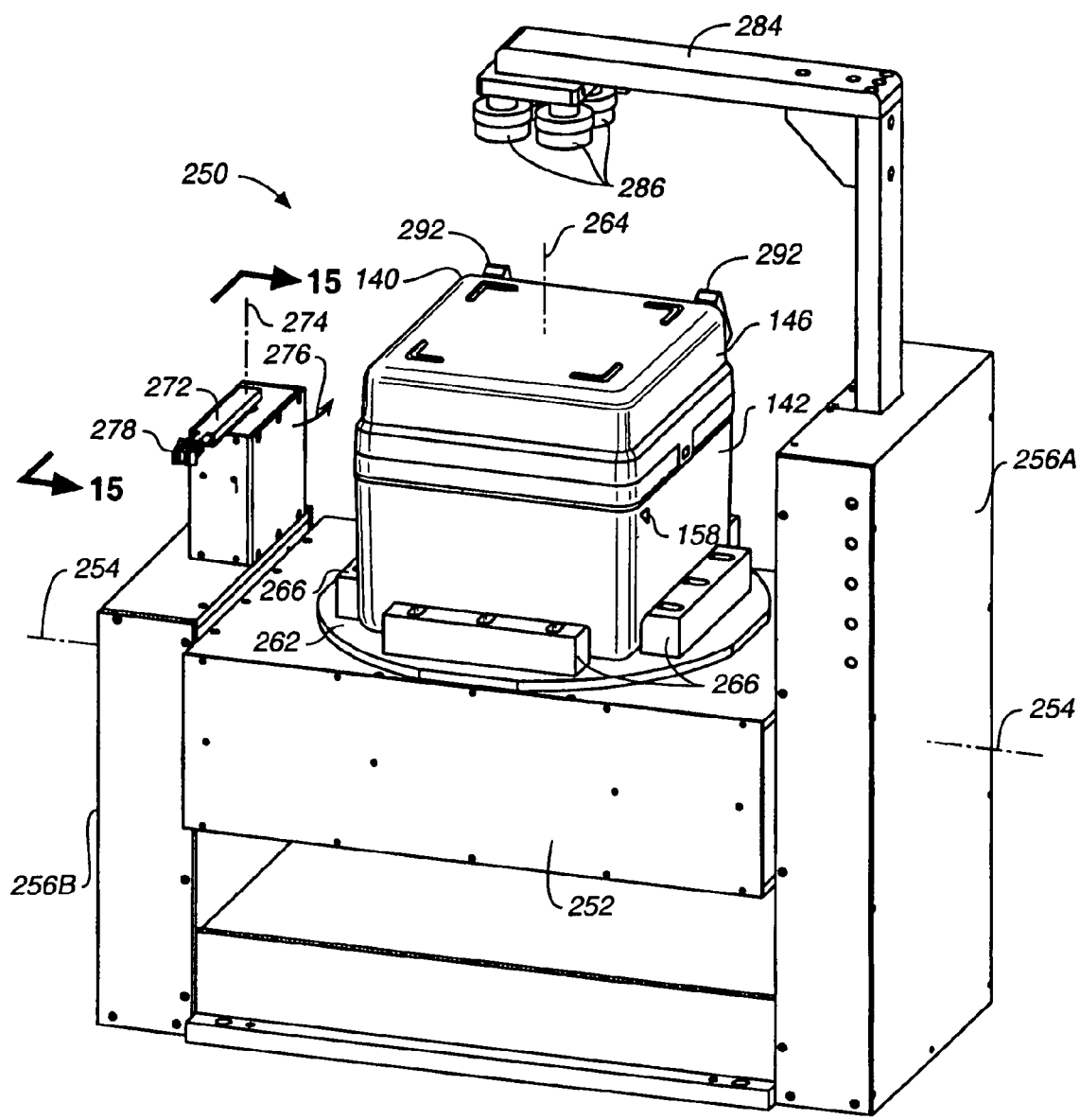
FIG._14

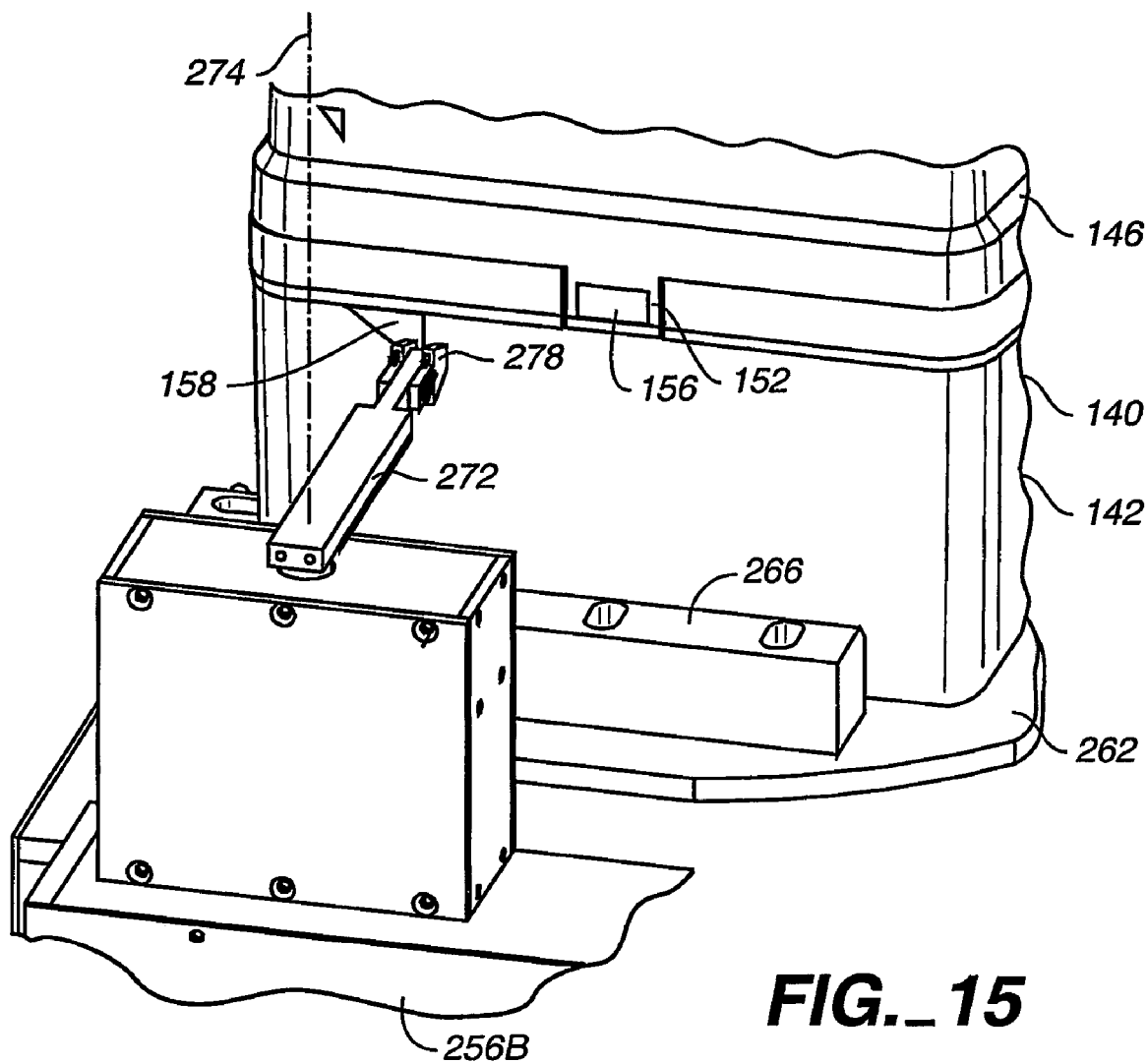
FIG._15

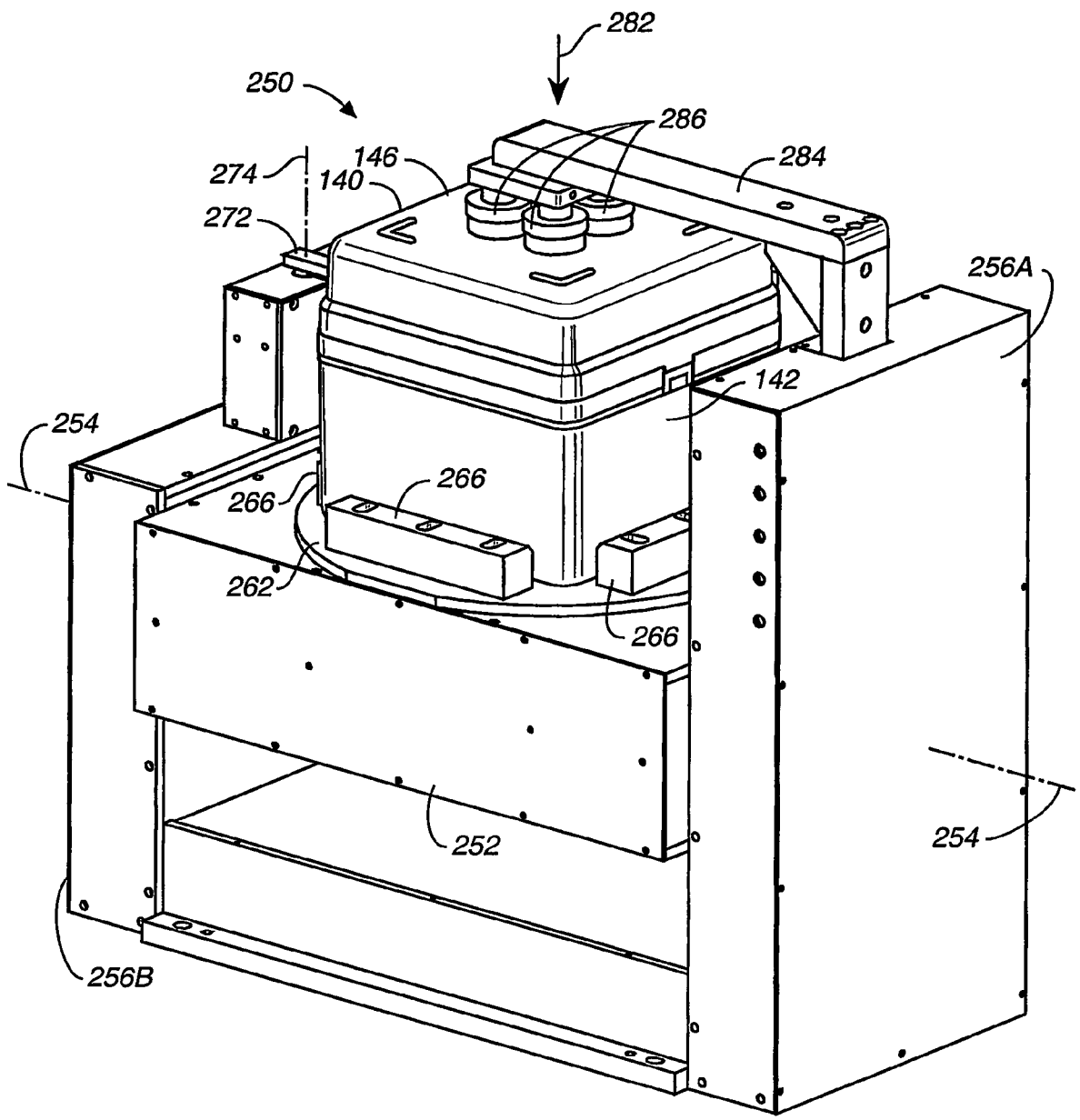
FIG._16

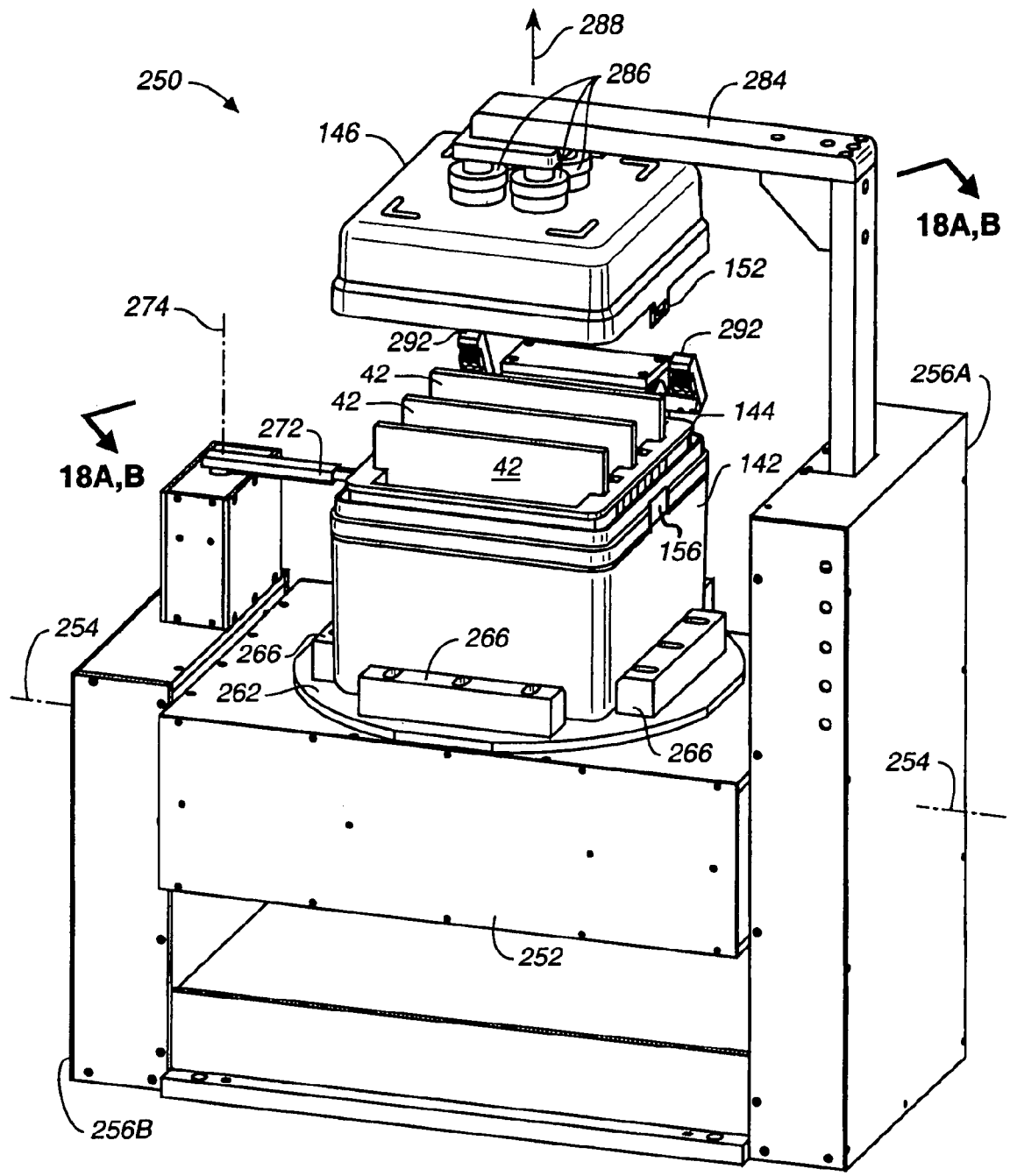
FIG._17

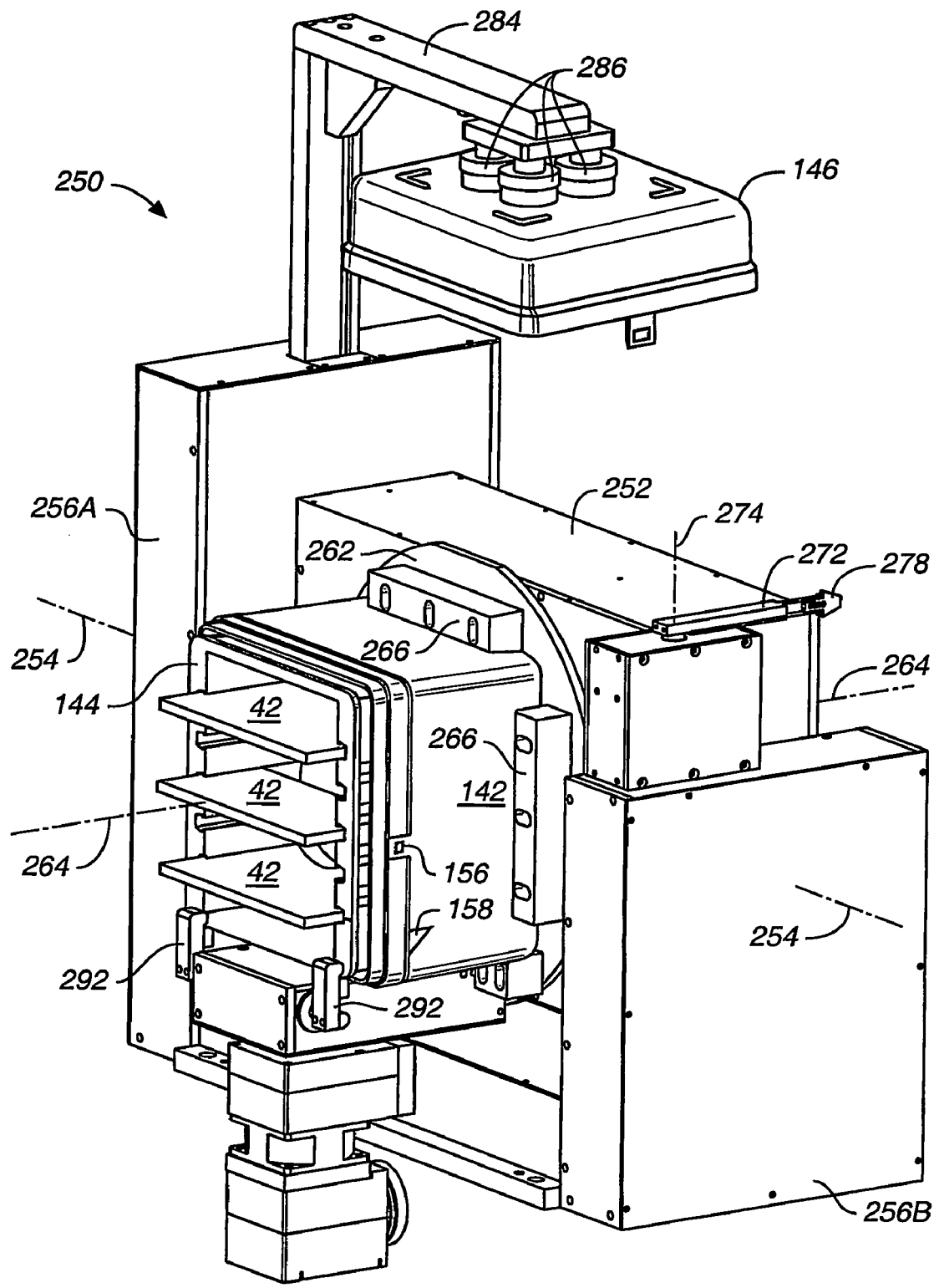
FIG._18A

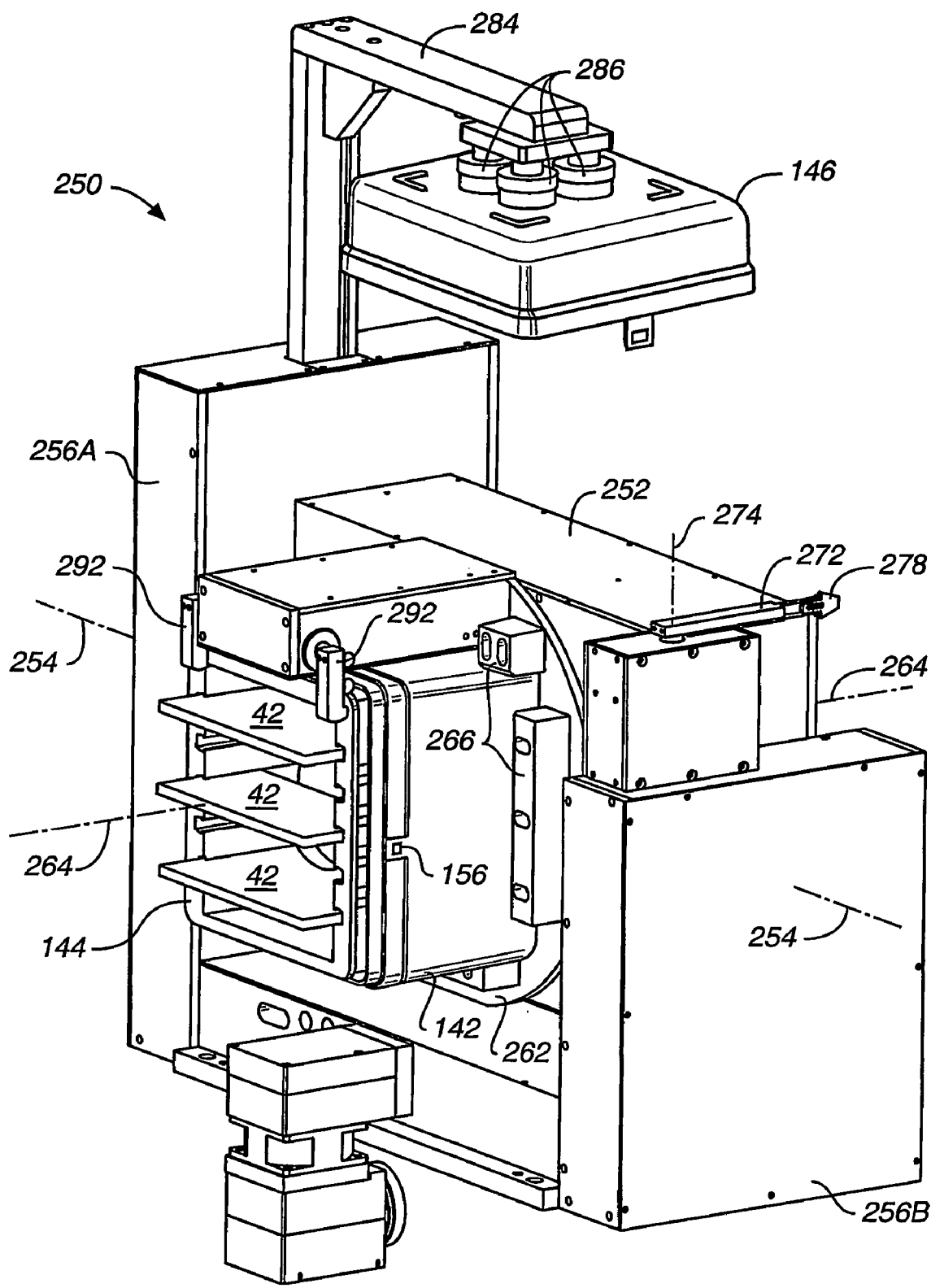
FIG._18B

UNIVERSAL RETICLE TRANSFER SYSTEM

TECHNICAL FIELD

The present invention relates generally to the technical field of automated tools used for integrated circuit fabrication and, more particularly, to automated reticle handling tools.

BACKGROUND ART

Presently, conventional processes for manufacturing integrated circuits ("ICs") include a number of process steps in which a surface of a semiconductor wafer is first coated with a thin layer of a photo-resist material after which the photo-resist material is irradiated with short wavelength light to form a latent image of a pattern in the photo-resist layer. A subsequent processing step develops the latent image thereby leaving patterned photo-resist material on a wafer's surface. In processing a semiconductor wafer to fabricate ICs, the preceding procedure for establishing patterned photo-resist material on a wafer's surface may be repeated dozens of times.

In irradiating photo-resist material, the short wavelength light used in forming the latent image passes first through a reticle before impinging upon the thin layer of photo-resist material. In general, reticles used in IC fabrication are made from a thick, planar, rectangularly or square shaped pieces of glass. The reticle is opaque in those areas of the pattern where the reticle blocks the short wavelength light from impinging upon the thin layer of photo-resist material. The pattern formed in the photo-resist layer on a wafer's surface generally differs for each of the dozens of photo-resist exposures performed during IC fabrication. Thus, fabricating a particular type of IC may require a dozen or more reticles.

Because reticles are high precision optical devices, they are comparatively expensive. Each individual reticle can cost between $5,000.00 and $30,000.00 depending upon the size of the smallest feature in the pattern to be formed in the photo-resist layer on the wafer's surface. Consequently, a complete set of reticles needed for fabricating a single type of IC may cost several hundred thousand dollars. Correspondingly, the photolithographic equipment which receives both the reticle and the wafer for exposing the photo-resist layer to short wavelength light is also comparatively expensive costing several million dollars.

A typical IC factory, commonly referred to as a "fab," may include several different models of photolithographic equipment from different manufacturers, or different models of photolithographic equipment from the same manufacturer. While these differing models of photolithographic equipment will all accept the same set of reticles used in manufacturing a single type of IC, previously there has existed no standard cassette for holding the set of reticles while individual reticles are automatically loaded into and removed from the photolithographic equipment. That is, individual photolithographic equipment manufacturers have arbitrarily selected unique configurations for cassettes used for holding reticles while individual reticles are automatically loaded into and removed from the photolithographic equipment. Thus, worldwide presently there are in daily use in IC fabs reticle cassettes having dozens of different, incompatible configurations. Consequently, if a set of reticles for manufacturing a particularly type of IC are loaded into a cassette for a particular type of photolithographic equipment and that particular photolithographic equipment is unavailable while another model of photolithographic equipment is available, presently the reticles must be manually moved from one style of cassette that is incompatible with the available photolithographic equipment to another style of cassette that is compatible with the available photolithographic equipment.

In an effort to standardize reticle cassettes among the products of various photolithographic equipment manufacturers, recently Semiconductor Equipment and Materials International ("SEMI") has adopted a standard, i.e. SEMI E100-0302, entitled "Specification for a Reticle SMIF Pod (RSP) Used to Transport and Store 6 Inch or 230 mm Reticles." As implied by the name of the SEMI standard, the configuration of RSP is an adaptation of a previously existing Standard Mechanical InterFace ("SMIF") pod which is widely used in IC fabs for carrying 8-inch semiconductor wafers during wafer processing. While it appears likely that sometime in the future all photolithographic equipment will accept the RSP for holding a set of reticles while individual reticles are automatically loaded into and removed from the photolithographic equipment, due to the presently existing large installed base of photolithographic equipment such a situation is unlikely to occur in the immediately foreseeable future. Thus, for the foreseeable future a need will continue to exist for automatically moving reticles from one style of cassette to another style of cassette.

Other considerations existing in conventional photolithographic processing exacerbate the need to move reticles from one style of cassette to another style of cassette. The physical properties of the thin photo-resist layer degrade over time. While the severity of such degradation increases with the interval that elapses between coating a wafer's surface and exposing the photo-resist material, depending upon precise characteristics of environmental conditions to which the photo-resist layer is exposed, the interval after which the yield of good ICs from a wafer becomes economically unacceptable can be as short as tens of minutes up to several hours. Thus, once a wafer has been coated with a thin layer of photo-resist material there exists a significant economic incentive to expose the photo-resist layer as quickly as practicable. Consequently, if reticles for a particular type of IC are held in a cassette for a model of unavailable photolithographic equipment, there exists a correspondingly significant economic incentive to quickly move the reticles from one style of cassette to another style of cassette that is compatible with an available model of photolithographic equipment. However, a lack of commonality among the dozens of different reticle cassette configurations has prevented the development of automatic equipment for transferring reticles between cassettes having differing configurations.

As is well known to those skilled in the art of IC fabrication, contamination must be reduced as much as practicable, or even eliminated if possible, within an IC fab. Consequently any automatic equipment for transferring reticles between cassettes having differing configurations must preserve the cleanliness of the fab, particularly cleanliness of reticles passing through the equipment.

DISCLOSURE OF INVENTION

An object of the present invention is to provide SMIF pods that are adapted for receiving and holding a reticle cassette or reticle holder having a particular configuration.

Another object of the present invention is to provide SMIF pods that carry a unique, machine-readable code for specifying which particular type of reticle cassette or reticle holder that the SMIF pod is adapted to receive and hold.

Another object of the present invention is to provide a reticle transfer system that effects automatic transfer of reticles between a pair of reticle cassettes and/or reticle holders.

Another object of the present invention is to provide a reticle transfer system which moves reticles automatically between a pair of reticle cassettes and/or reticle holders through a controlled environment maintained within the reticle transfer system.

Another object of the present invention is to provide a reticle transfer system which ascertains from a unique, machine-readable code carried by a SMIF pod which particular type of reticle cassette or reticle holder the SMIF pod carries.

Another object of the present invention is to provide a reticle transfer system that is capable of ascertaining the orientation of a reticle-shipping container received in a reticle reointer of the reticle transfer system.

The present invention includes a reticle transfer system that:
1. receives a pair of SMIF pods that have been adapted to receive and hold one particular type of reticle cassette or reticle holder from among dozens of different configurations;
2. interrogates each of the SMIF pods to ascertain the particular type of reticle cassette or reticle holder configuration carried by the SMIF pod; and
3. automatically moves reticles through a controlled environment from a reticle cassette or reticle holder in one of the SMIF pods to a reticle cassette or reticle holder in the other SMIF pod where the cassettes or reticle holders have differing configurations.

One aspect of the present invention is a reticle transfer system having an end effector which permits ascertaining, from a unique, machine-readable code carried by a SMIF pod, which particular type of reticle cassette or reticle holder the SMIF pod carries. A second aspect of the present invention is a reticle transfer system having a box-opening-station reticle reorienter for receiving a reticle-shipping container having at least one reticle present therein, and ascertaining the orientation thereof.

These and other features, objects and advantages will be understood or apparent to those of ordinary skill in the art from the following detailed description of the preferred embodiment as illustrated in the various drawing figures.

BRIEF DESCRIPTION OF DRAWINGS

FIG. 1 is a perspective view that depicts a SMIF pod;

FIG. 2 is a perspective view that depicts a base of a SMIF pod that has been adapted to receive and hold a particular type of reticle-holding cassette or reticle holder;

FIG. 3 is a perspective view that depicts a universal reticle transfer system that includes a plurality of SMIF pod openers which is adapted for automatically moving reticles between pairs of reticle-holding cassettes or reticle holders carried within SMIF pods, and that also includes a reticle reorienter;

FIG. 4 is a perspective view that depicts a pair of SMIF pods such as may be received into adjacent SMIF pod openers included in the system depicted in FIG. 3;

FIG. 5 is a perspective view that depicts a pair of bases of SMIF pods that respectively carry reticle-holding cassettes which SMIF pod openers have exposed by removing the SMIF covers therefrom;

FIG. 6 is an exploded perspective view that depicts a first embodiment of end effector adapted for attachment to an otherwise conventional robotic arm mechanism included in the system depicted in FIG. 3 which adapts the robotic arm mechanism for gripping reticles that are carried in reticle-holding cassettes such as those depicted in FIG. 5, or in reticle holders;

FIG. 7 is a perspective view that depicts a reticle cassette having a structure which prevents an end of the end effector depicted in FIG. 6 from extending past an edge of a reticle carried therein that is distal from the system's robotic arm mechanism;

FIG. 8 is an exploded perspective view that depicts a second embodiment for end effector adapted for attachment to an otherwise conventional robotic arm mechanism included in the system depicted in FIG. 3 which adapts the robotic arm mechanism for gripping reticles that are carried in reticle cassettes;

FIGS. 9A and 9B respectively depict reticle holders each of which receives and holds only a single reticle;

FIG. 10 is a perspective view that depicts one particular type of reticle-shipping container having an outer box which receives a reticle carrier that holds vertically oriented reticles;

FIG. 11A is a perspective view depicting one side of the reticle carrier taken along a line 11A-11A in FIG. 10;

FIG. 11B is a perspective view depicting another side of the reticle carrier taken along a line 11B-11B in FIG. 11A;

FIG. 12A is a perspective view depicting one embodiment of the reticle reorienter called a tilt station as it appears to an operator before placing the reticle carrier depicted in FIGS. 11A and 11B thereon;

FIG. 12B is a perspective view depicting the tilt station taken along a line 12B-12B in FIG. 12A as the tilt station appears when viewed from within the reticle transfer system, and when the tilt station is positioned so a reticle carrier as may be held thereby is properly oriented for exchanging reticles with a reticle cassette or with a reticle holder;

FIG. 13 is a perspective view depicting an alternative embodiment reticle reorienter called a box-opening station as it appears to an operator before placing the reticle-shipping container depicted in FIG. 10 thereon;

FIG. 14 is a perspective view depicting the box-opening station of FIG. 13 with the reticle-shipping container of FIG. 10 placed thereon;

FIG. 15 is an enlarged perspective view taken along a line 15-15 in FIG. 14 that depicts a portion of the outer box that carries the registration tag, and a portion of the box-opening station which includes a orientation probe that interrogates the registration tag;

FIG. 16 is a perspective view depicting the box-opening station of FIG. 13 with the reticle-shipping container placed thereon after successfully scanning a registration tag to establish that the reticle-shipping container is properly oriented within the reticle transfer system and therefore ready for removing a box cover included therein;

FIG. 17 is a perspective view depicting the box-opening station of FIG. 13 with the box cover of the reticle-shipping container removed, and with the registration-tag scanner interrogating the registration tag; and FIGS. 18A and 18B are perspective views of the box-opening station as it appears when viewed from within the reticle transfer system along a line 18AB-18AB in FIG. 17, and when the box-opening station is positioned so a reticle carrier held thereby is oriented for exchanging reticles with a reticle cassette or with a reticle holder.

BEST MODE FOR CARRYING OUT THE INVENTION

FIG. 1 illustrates a SMIF pod, referred to by the general reference character 20, that includes a SMIF cover 24 and a SMIF base 26. As described in U.S. Pat. No. 5,984,610 that is incorporated herein by reference, when used for carrying semiconductor wafers, the SMIF cover 24 of the SMIF pod 20 may be unlatched from the SMIF base 26 and raised up to expose a wafer-carrier that was previously enclosed therein.

FIG. 2 illustrates an upper surface 28 of the SMIF base 26 of the SMIF pod 20 with the SMIF cover 24 removed. In the illustration of FIG. 2, L-shaped blocks 32 and pins 34 (only one of which is visible in FIG. 2) have been affixed to the SMIF base 26 thereby adapting the SMIF base 26 to receive and hold one particular type of reticle cassette 36 selected from among the dozens of different configurations for the reticle cassette 36. As illustrated in FIG. 2, received and held on the SMIF base 26 the reticle cassette 36 supports several reticles 42 oriented parallel to the upper surface 28 of the SMIF base 26 in slots 44 that may be provided by various different structures depending upon the particular type of reticle cassette 36.

FIG. 2 depicts one possible configuration of L-shaped blocks 32 and pins 34 selected to adapt the SMIF base 26 to receive and hold one particular type of reticle cassette 36. The specific configuration of structures affixed to the upper surface 28 of the SMIF base 26 will vary depending upon the particular type of reticle cassette 36 which the SMIF base 26 is adapted to receive and hold.

Also affixed to the SMIF base 26 is cassette-type encoder 48 which carries a unique, machine-readable code that specifies the particular type of reticle cassette 36 that the SMIF base 26 is adapted to receive and hold. The presently preferred embodiment of the cassette-type encoder 48 is a block of material that is pierced by one or more holes which are oriented parallel to the upper surface 28 of the SMIF base 26. To ascertain the particular type of reticle cassette 36 that the SMIF base 26 is adapted to receive and hold, the cassette-type encoder 48 may be scanned parallel to the upper surface 28 of the SMIF base 26 by a beam of light to determine if a hole pierces the cassette-type encoder 48 at preestablished locations arranged along the cassette-type encoder 48.

FIG. 3 illustrates a universal reticle transfer system, referred to by the general reference character 50, for automatically moving reticles 42, through a controlled environment maintained within the reticle transfer system 50, between a pair of reticle cassettes 36 which may have differing configurations. The reticle transfer system 50 includes SMIF pod openers 52, at least two (2) but preferably three (3), which preferably are of the type described in U.S. Pat. No. 5,984,610. Two of the pod openers 52 respectively concurrently receive sealed SMIF pods 20 carrying reticle cassettes 36 such as the SMIF pods 20 illustrated in FIG. 4. Each of the pod openers 52 then unlatches the SMIF cover 24 from the SMIF base 26 and raises the SMIF cover 24 upward from the SMIF base 26 to thereby expose, as illustrated in FIG. 5, the reticle cassettes 36 that are respectively carried on SMIF bases 26. The reticle transfer system 50 also includes an operator's console 54 that is disposed to one side of the pod openers 52. The reticle transfer system 50 further includes an reticle reorienter 56 that is located on the opposite side of the pod openers 52 from the operator's console 54.

Disposed within the reticle transfer system 50 is a mostly conventional robotic arm mechanism not illustrated in any of the FIGs. The robotic arm mechanism is capable of moving laterally within the reticle transfer system 50 to confront any of the pod openers 52 or the reticle reorienter 56. The robotic arm mechanism is also adapted to move vertically up and down along, and to extend toward and retract from any of the pod openers 52 or the reticle reorienter 56.

FIG. 6 depicts a first embodiment for an end effector 72 that is included in the robotic arm mechanism of the reticle transfer system 50. The end effector 72 is secured at an end of the robotic arm mechanism to be, at various times, thereby positioned adjacent to one of the pod openers 52 or to the reticle reorienter 56. A top cover 74 and a bottom cover 76, when secured to a mounting plate 78, enclose various components of the end effector 72. Opposite sides of an end 82 of a reticle-support blade 84, that projects outward from the mounting plate 78 which is nearer to the robotic arm mechanism, respectively carry a pair of front grippers 86. Opposite halves of a thru-beam fiber optic sensor 92 are also disposed at the end 82 of the reticle-support blade 84, between the front grippers 86, and on opposite sides of an elongated notch 94 that pierces the reticle-support blade 84. After the pod openers 52 open SMIF pods 20 by raising the SMIF covers 24 upward from the SMIF bases 26 thereby exposing the reticle cassettes 36, the robotic arm mechanism may move the notch 94 in the mounting plate 78 along the SMIF base 26 about the cassette-type encoder 48 so a beam of light passing between opposite halves of the thru-beam fiber optic sensor 92 interrogates the cassette-type encoder 48 for the presence or absence of holes piercing the cassette-type encoder 48 at preestablished locations. In this way the reticle transfer system 50 may ascertain the particular type of reticle cassette 36 that each SMIF base 26 is adapted to receive and hold.

While the cassette-type encoder 48 and the thru-beam fiber optic sensor 92 are the presently preferred embodiment of the invention for ascertaining the particular type of reticle cassette 36 that each SMIF base 26 is adapted to receive and hold, it is readily apparent that there exist various alternative ways in which this could be accomplished. Thus, to permit ascertaining the particular type of reticle cassette 36 that each SMIF base 26 is adapted to receive and hold, a SMIF base 26 in accordance with the present invention may be equipped, for example, with an ID tag that is read using a radio frequency transmission, a reflective/scattering optical ID tag such as a bar code tag, a magnetic stripe ID tag, an ID tag that is read by mechanical contact, an ID tag that is read pneumatically, an ID tag that is read acoustically, etc.

In addition to the thru-beam fiber optic sensor 92, also mounted at the end 82 of the mounting plate 78 to one side of the thru-beam fiber optic sensor 92 is an optical reticle-presence sensor 98. After the reticle transfer system 50 using the thru-beam fiber optic sensor 92 on the end effector 72 has ascertained the particular type of reticle cassette 36 that is present on the SMIF base 26, the reticle transfer system 50 moves the end effector 72 vertically along an edge of the reticle cassette 36 resting on the SMIF base 26. In accordance with the disclosure of U.S. Pat. No. 6,013,920 that is hereby incorporated by reference, using electrical signals produced by the reticle-presence sensor 98 the reticle transfer system 50 is able to ascertain where the reticle cassette 36, i.e. which of the slots 44 in the reticle cassette 36, actually carries a reticle 42.

Having thus determined which slots 44 within the two reticle cassettes 36 carry reticles 42 and which slots 44 are empty, the reticle transfer system 50 then proceeds to move reticles 42, one-by-one, from one of the reticle cassettes 36 to empty slots 44 in the other reticle cassette 36. In moving each reticle 42, the robotic arm mechanism inserts the end effector 72 horizontally beneath the reticle 42 until the grooved front grippers 86 are positioned to receive an edge of the reticle 42 that is located furthest from the mounting plate 78 and from the robotic arm mechanism. After the grooved front grippers 86 are positioned to receive an edge of the reticle 42, the reticle transfer system 50 raises the end effector 72 until the grooved front grippers 86 engage that edge of the reticle 42. After the grooved front grippers 86 engage the edge of the reticle 42, a pneumatic cylinder 102 included in the end effector 72 urges a rear gripper 104 horizontally toward the edge of the reticle 42 that is nearest to the mounting plate 78, i.e. furthest from the front grippers 86. Angled surfaces 108, located at opposite ends of the rear gripper 104, engage opposite corners of the reticle 42 and urge it toward a centered position on the end effector 72.

With the end effector 72 thus supporting and clamping the reticle 42 between the front grippers 86 and the rear gripper 104, the robotic arm mechanism then withdraws the reticle 42 from the reticle cassette 36 into the controlled environment within the reticle transfer system 50, and then moves laterally to the other reticle cassette 36 and vertically to an empty slot 44 in the reticle cassette 36. Thus positioned adjacent to an empty slot 44, the robotic arm mechanism inserts the end effector 72 and the reticle 42 clamped thereto into the empty slot 44 to deposit the reticle 42 therein. Having thus moved one reticle 42 from one reticle cassette 36 to another reticle cassette 36, the reticle transfer system 50 repeats the process until all specified reticles 42 have been moved from one reticle cassette 36 to the other reticle cassette 36.

One operational condition for which the reticle transfer system 50 as described thus far is unsuitable is removing reticles 42 from and inserting reticles 42 into reticle cassettes 36 where the structure of the reticle cassette 36 prevents the end 82 of the end effector 72 from extending past the edge of the reticle 42 furthest from the mounting plate 78. FIG. 7 illustrates one such type of reticle cassette 36 which includes a pair of cruciform bars 112 which span one opening 114 in the reticle cassette 36 to thereby prevent reticles 42 from passing therethrough. To permit initially engaging reticles 42 that are held in such reticle cassettes 36, the rear gripper 104 of the end effector 72 illustrated in FIG. 6 includes a vacuum port 116. After extending the rear gripper 104 furthest from the mounting plate 78, using the pneumatic cylinder 102 the reticle transfer system 50 causes the end effector 72 to engage the reticle 42 thereby establishing with the vacuum port 116 a vacuum chuck which secures the reticle 42 to the end effector 72.

With the reticle 42 now secured to the end effector 72, the reticle transfer system 50 causes the end effector 72 to retract a short distance along the slots 44 thereby establishing a space within the reticle cassette 36 depicted in FIG. 7 beyond the reticle 42 into which the end 82 may now be positioned beyond the edge of the reticle 42 furthest from the mounting plate 78. After moving the reticle 42 this short distance, the end effector 72 releases the reticle 42. With the reticle 42 thus positioned so the front grippers 86 of the end effector 72 may now engage the edge of the reticle 42 furthest from the mounting plate 78, the reticle transfer system 50 then proceeds to grasp and move the reticle 42 as described previously.

After the reticle 42 has been moved to a slot 44 in the other reticle cassette 36, if the structure of the receiving reticle cassette 36 bars the end effector 72 from inserting the reticle 42 fully into the slot 44, the reticle transfer system 50 deposits the reticle 42 part way along the slot 44, releases the reticle 42, and then using the rear gripper 104 nudges the reticle 42 the remaining distance along the slot 44 until the reticle 42 is fully inserted into the reticle cassette 36.

FIG. 8 illustrates a second embodiment for the end effector 72. Those elements depicted in FIG. 8 that are common to the end effector 72 illustrated in FIG. 6 carry the same reference numeral distinguished by a prime ("'") designation. The end effector 72' depicted in FIG. 8 differs from the end effector 72 depicted in FIG. 6 by having a fixed, rather than moving, rear gripper 104', and by including a pair of moveable side grippers 122. Secured at an end of each side gripper 122 is U-shaped reticle clamp 124. The reticle clamps 124 are respectively shaped to receive and mate with an edge of the reticle 42 when they close toward each other along arcuate paths illustrated by curved arrows 126 in FIG. 8. While the reticle clamps 124 engage opposite sides of a reticle 42 thereby clamping the reticle 42 to the end effector 72', the side grippers 122 particularly restrain the reticle 42 from moving horizontally with respect to the reticle-support blade 84'. Though not illustrated in any of the Figures, as is readily apparent the reticle clamps 124 may close toward each other along a linear path rather than the arcuate paths indicated by the curved arrows 126 in FIG. 8.

In addition to the arcuate motion of the reticle clamps 124 for gripping and releasing the reticle 42, as indicated by straight arrows in FIG. 8 both of the side grippers 122 are moveable laterally both toward and away from the end 82' of the end effector 72'. Such linear motion of the reticle clamps 124 permits them to be positioned to avoid colliding with various different types of reticle cassettes 36 when engaging a reticle 42 carried therein.

There exists yet a third embodiment for the end effector 72 which combines the reticle gripping aspects of both embodiments described above and depicted respectively in FIGS. 6 and 8. Accordingly, this third embodiment for the end effector 72 includes both the moveable rear gripper 104 and the moveable side grippers 122. Thus, while the embodiments for the end effector 72 depicted in FIGS. 6 and 8 respectively grip the reticle 42 either along edges thereof which are transverse to the reticle-support blade 84 in the instance of FIG. 6, or parallel to the reticle-support blade 84' in the instance of FIG. 8, the third embodiment for the end effector 72 grips the reticle 42 along edges thereof which are both transverse to and parallel to the reticle-support blade 84.

In addition to reticle cassettes 36 which are capable of simultaneously receiving and holding a number of reticles 42, there exist reticle holders 132, such as those respectively depicted in FIGS. 9A and 9B which, which have differing configurations, and which receive and hold only a single reticle 42. While reticle cassettes 36 which simultaneously receive and hold a number of reticles 42 are used almost exclusively during reticle fabrication, reticle holders 132, such as those respectively depicted in FIGS. 9A and 9B which receive and hold only one (1) reticle 42, are used both during reticle fabrication, and during IC fabrication. To protect reticles 42 from contamination, in accordance with the present invention SMIF bases 26 of SMIF pods 20 are also specifically adapted, in a manner similar to that described previously for the reticle cassettes 36, to receive and hold a particular type of reticle holder 132, such as those illustrated in FIGS. 9A and 9B, that receives and holds only one (1) reticle 42.

In removing a reticle 42 from either type of reticle cassette 36 depicted respectively in FIGS. 9A and 9B, generally the reticle-support blade 84 of the end effector 72 or 72' first moves beneath the reticle 42 until the front grippers 86 extend beyond the far edge of the reticle 42. When the front grippers 86 extend beyond the far edge of the reticle 42, the robotic arm mechanism raises the end effector 72 or 72' first to engage the reticle 42 and then to elevate it above projecting posts 136 which are shaped to receive and hold the reticle 42. After the reticle 42 has been raised above the posts 136, either of the gripper mechanisms described above which are respectively depicted in FIGS. 6 and 8, or a combination thereof, are activated to clamp the reticle 42 to the end effector 72 before beginning to move the reticle 42 to a reticle cassette 36 or to a different type of reticle holder 132. The reticle transfer system 50 may deliver each reticle 42 removed from a reticle holder 132 to a slot 44 in a reticle cassette 36 as described above. Alternatively, the reticle transfer system 50 may place individual reticle 42 onto the posts 136 of any of the various styles of reticle holders 132 by reversing the process described above for removing the reticle 42 from the reticle holder 132.

Reticles initially arrive at an IC fab in various different styles of highly specialized shipping containers. FIG. 10 illustrates one particular type of shipping container, called a Hoya container, that is identified in that Figure by the general reference character 140. The Hoya reticle-shipping container 140 includes a hollow outer box 142 which receives a separate inner reticle carrier 144. Mating structures on an outer surface of the reticle carrier 144 and on an inner surface of the outer box 142 constrain the outer box 142 to receive the reticle carrier 144 in only one orientation.

A box cover 146, included in the reticle-shipping container 140, mates snugly with the outer box 142 to seal a reticle carrier 144 carrying vertically oriented reticles 42 within a closed reticle-shipping container 140. A pair of cover catches 152 that are located on opposite sides of the box cover 146, only one of which appears in FIG. 10, project downward toward the outer box 142. Rectangularly shaped apertures 154, which pierce each of the cover catches 152, respectively mate with tabs 156 which protrude outward from opposite outer surfaces of the outer box 142. Engagement of the apertures 154 with their respective tabs 156 locks the box cover 146 onto the outer box 142. A single triangularly shaped registration tag 158, that protrudes from an outer surface of the outer box 142, indicates the orientation of the reticle carrier 144 within a sealed reticle-shipping container 140. The box cover 146 also includes a similar, triangularly shaped registration tag 159.

The reticle transfer system 50 includes the reticle reorienter 56 to permit automatically exchanging reticles 42 between a reticle carrier 144 and a reticle cassette 36 or a reticle holder 132. When reticles 42 are transported outside of a SMIF pod 20 in the reticle-shipping container 140, the reticles 42 are usually oriented vertically to reduce any possibility that the reticles 42 might be dropped or become contaminated. To provide compatibility with this mode of reticle transportation, as described in greater detail below, the reticle reorienter 56 in one embodiment accepts just the reticle carrier 144 in which the reticles 42 are oriented vertically, rotates the reticle carrier 144 90° about a horizontal axis until the reticles 42 are oriented horizontally. Another embodiment of the reticle reorienter 56, also described in greater detail below, accepts the entire reticle-shipping container 140 carrying the reticle carrier 144 together with the vertically oriented reticles 42, removes the box cover 146, and then rotates the outer box 142 together with the reticle carrier 144 90° about a horizontal axis until the reticles 42 are oriented horizontally. After either embodiment of the reticle reorienter 56 orients the reticles 42 horizontally, the end effector 72 may grasp individual reticles 42 and move them to a reticle cassette 36 or to a reticle holder 132 that is located in one of the pod openers 52. Similarly, either embodiment of the reticle reorienter 56 may re-orient reticles 42 from a horizontal orientation in which they are received from a reticle cassette 36 or from a reticle holder 132 to a vertical orientation in the reticle carrier 144 for transfer out of the reticle transfer system 50.

In addition to permitting automatic exchange of reticles 42 between a reticle carrier 144 and a reticle cassette 36 or a reticle holder 132, the reticle reorienter 56 may also be used advantageously for buffering excess reticles 42. Thus, for example, if a reticle cassette 36 from which the reticle transfer system 50 is removing reticles 42 holds more reticles 42 than the reticle cassette 36 or reticle holder 132 to which the reticle transfer system 50 is transferring the reticles 42, then excess reticles 42 may be stored temporarily into a reticle carrier 144 that is present in the reticle reorienter 56. Subsequently, the reticle transfer system 50 may move the reticles 42 stored temporarily in the reticle carrier 144 into empty slots 44 in a reticle cassette 36 or in a reticle holder 132 that is subsequently loaded into one of the pod openers 52. Alternatively, the reticle transfer system 50 may also include a mini-stocker to provide the reticle transfer system 50 with a capability for buffering excess reticles 42.

FIGS. 11A and 11B respectively illustrate from differing viewpoints the reticle carrier 144 that is included in the Hoya reticle-shipping container 140. FIG. 11A illustrates differing size cavities 172A and 172B formed in an outer surface 174 of the reticle carrier 144. As stated previously, differing sizes of the cavities 172A and 172B in combination with corresponding structures on the inner surface of the outer box 142 constrain the outer box 142 to receive the reticle carrier 144 in only one orientation. FIG. 11A also clearly depicts slots 176 included in the reticle carrier 144 each pair of which disposed along opposite sides of the reticle carrier 144 receives a single reticle 42. The illustration of FIG. 11B shows two sets of five (5) trapezoidally shaped apertures 182 which pierce a bottom surface 184 of the reticle carrier 144 at the base of each of the slots 176.

FIG. 12A illustrates one embodiment of the reticle reorienter 56 called a tilt station that is identified by the general reference character 200. The illustration of FIG. 12A depicts the tilt station 200 as it appears to an operator of the reticle transfer system 50 before placing a reticle carrier 144 thereon.

The tilt station 200 includes an open, box-shaped carrier receiver 202 which is supported between two bulkheads 204A and 204B for rotation about a horizontal axis 206. In the illustration of FIG. 12A, two rows containing five pins 212 each project upward from a horizontally oriented carrier table 214 included in the carrier receiver 202. A first pair of retaining plates 216A and 216B also project from the carrier table 214 respectively across opposite ends of the rows of pins 212. A second pair of retaining plates 218A and 218B similarly project from the carrier table 214 respectively parallel to and outward from the rows of pins 212. The size and arrangement of the pins 212 on the carrier table 214 adapt each of them to enter into and mate snugly with one of the apertures 182 which pierce the bottom surface 184 of the reticle carrier 144 depicted in FIG. 11B. The shape and location of the retaining plates 216A, 216B, 218A and 218B on the carrier table 214 juxtaposes them with the outer surface 174 of a reticle carrier 144 installed on the pins 212. Edges of the retaining plates 216A, 216B, 218A and 218B furthest from the carrier table 214 and nearest to the pins 212 are chamfered for guiding a reticle carrier 144 onto the pins 212.

When an operator of the reticle transfer system 50 removes the reticle carrier 144 from the reticle-shipping container 140 and places it onto the carrier table 214 in the orientation illustrated in FIG. 12A, reticles 42 present in the reticle carrier 144 are oriented vertically. To permit automatically exchanging reticles 42 between the reticle carrier 144 present in the tilt station 200 embodiment of the reticle reorienter 56 and a reticle cassette 36 or a reticle holder 132 present and exposed in one of the pod openers 52, an electrical motor 222 secured to the bulkhead 204B rotates the carrier receiver 202 90° about the axis 206 until the carrier table 214 becomes oriented vertically as illustrated in FIG. 12B. Frictional engagement between the reticle carrier 144 and the pins 212 and retaining plates 216A, 216B, 218A and 218B of the tilt station 200 retains the re-oriented reticle carrier 144, in which reticles 42 are now oriented horizontally, in the carrier receiver 202. With reticles 42 in the reticle carrier 144 thus oriented horizontally, using the end effector 72 or 72' the robotic arm mechanism may, in the manner described previously, effect an exchange of reticles 42 between the reticle carrier 144 and a reticle cassette 36 or a reticle holder 132 present and exposed in one of the pod openers 52.

FIG. 13 is a perspective view depicting an alternative embodiment reticle reorienter 56 called a box-opening station that is referred to by the general reference character 250. The box-opening station 250 includes a tilt table 252 which is supported for rotation about a horizontal axis 254 by a pair of bulkheads 256A and 256B. The tilt table 252 carries a rotary table 262 which turns about a vertical axis 264. A set of box guides 266 are secured to the rotary table 262 arranged in a rectangular shape which snugly receives the outer box 142 of the reticle-shipping container 140. Edges of the box guides 266 about the perimeter of the rectangular shape are chamfered for guiding the outer box 142 onto the rotary table 262 as illustrated in FIG. 14.

After an operator places the outer box 142 of the reticle-shipping container 140 onto the rotary table 262, the reticle transfer system 50 checks the orientation of the outer box 142 to ascertain an orientation for the reticle carrier 144 carried therein. The reticle transfer system 50 checks the orientation of the outer box 142 by rotating an orientation-probe arm 272 of an orientation probe that is supported from the bulkhead 256B horizontally about a vertical axis 274 as indicated by a curved arrow 276. In this way the reticle transfer system 50 juxtaposes a probe head 278 carried at a distal end of the orientation-probe arm 272 with the outer surface of the outer box 142.

With the reticle-shipping container 140 oriented as illustrated in FIG. 14, the probe head 278 fails to sense the registration tag 158 that protrudes from an outer surface of the outer box 142. When the reticle transfer system 50 fails to find the registration tag 158, the orientation-probe arm 272 rotates away from the outer box 142 and the rotary table 262 carrying the reticle-shipping container 140 rotates 180° C. about the axis 264 which is oriented parallel to reticles 42 carried by the reticle carrier 144 of the reticle-shipping container 140. Having now positioned the outer box 142 in this alternative orientation, for a second time the orientation-probe arm 272 rotates about the axis 274 to juxtapose the probe head 278 with the outer surface of the outer box 142 as illustrated in FIG. 15. In this way the reticle transfer system 50 initially ensures that the orientation of the reticle-shipping container 140 places the registration tag 158 protruding from the outer box 142 near the bulkhead 256B.

With the reticle-shipping container 140 oriented as illustrated in 14, the probe head 278 fails to sense the registration tag 158 that protrudes from an outer surface of the outer box 142. When the reticle transfer system 50 fails to find the registration tag 158, the orientation-probe arm 272 rotates away from the outer box 142 and the rotary table 262 carrying the reticle-shipping container 140 rotates 180° about the axis 264 which is oriented parallel to reticles 42 carried by the reticle carrier 144 of the reticle-shipping container 140. Having now positioned the outer box 142 in this alternative orientation, for a second time the orientation-probe arm 272 rotates about the axis 274 to juxtapose the probe head 278 with the outer surface of the outer box 142 as illustrated in FIG. 15. In this way the reticle transfer system 50 initially ensures that the orientation of the reticle-shipping container 140 places the registration tag 158 protruding from the outer box 142 near the bulkhead 256B.

With the reticle-shipping container 140 now properly oriented on the tilt table 252 in the illustration of FIG. 16, as indicated by an arrow 282 a lid-lifting arm 284 supported from the bulkhead 256A descends until four suction cups 286 contact the box cover 146 of the reticle-shipping container 140. The reticle transfer system 50 then applies vacuum to the suction cups 286 thereby clamping the box cover 146 thereto.

For the embodiment of the box-opening station 250 depicted in FIGS. 13-16, an operator in placing the reticle-shipping container 140 onto the rotary table 262 releases the engagement between the cover catches 152 and the tabs 156. Alternatively, for automatically releasing the engagement between the cover catches 152 and the tabs 156 while an operator places the reticle-shipping container 140 onto the rotary table 262, the rotary table 262 may include two upwardly projecting blades juxtaposed with box guides 266 located on opposite sides of the rectangular area enclosed by the box guides 266. Projecting ends of the blades will then slip between the cover catches 152 and the outer box 142 while an operator places the reticle-shipping container 140 onto the rotary table 262 thereby releasing the box cover 146. With the box cover 146 released from the outer box 142 and with the suction cups 286 clamping the box cover 146, the lid-lifting arm 284 rises as indicated by an arrow 288 thereby opening the reticle-shipping container 140 as depicted in FIG. 17 to thereby expose both the reticle carrier 144 and the reticles 42 which it carries.

With the reticle carrier 144 thus exposed and resting within the outer box 142, a pair of box clamps 292, that as most clearly illustrated in FIG. 13 are supported from the rotary table 262, rotate about a horizontal axis 294 to engage one edge of the reticle carrier 144 thereby locking the outer box 142 and the reticle carrier 144 to the rotary table 262. With the outer box 142 and the reticle carrier 144 locked to the rotary table 262, the tilt table 252 then rotates 90° about the axis 254 until the rotary table 262 becomes oriented vertically as illustrated in FIG. 18A. Orienting the rotary table 262 vertically correspondingly orients reticles 42 in the reticle carrier 144 horizontally. With reticles 42 in the reticle carrier 144 thus oriented horizontally, using the end effector 72 or 72' the robotic arm mechanism may, in the manner described previously, effect an exchange of reticles 42 between the reticle carrier 144 and a reticle cassette 36 or a reticle holder 132 present and exposed in one of the pod openers 52.

As those skilled in the art are aware, reticles 42 usually carry a patterned layer of material, usually chromium, on only one surface to make the reticle 42 opaque in those areas of the pattern where the reticle blocks short wavelength light from impinging upon the thin layer of photo-resist material. Consequently, depending upon how reticles 42 are oriented within the reticle carrier 144, the orientation of reticles 42 depicted in FIG. 18A may be opposite to that needed when the reticles 42 are carried by a reticle cassette 36 or a reticle holder 132. The box-opening station 250 of the present invention addresses this possibility by being adapted to effect a rotation of the rotary table 262 180° about the axis 264 into the orientation depicted in FIG. 18B. However, the rotary table 262 does not move directly between the orientations respectively depicted in FIGS. 18A and 18B. In moving between those two orientations, the box-opening station 250 first returns the rotary table 262 to a horizontal orientation so reticles 42 present in the reticle carrier 144 are oriented vertically. With the reticles 42 thus oriented vertically in the reticle carrier 144, it is impossible for them to fall out of the reticle carrier 144 while the rotary table 262 effects a 180° rotation. Having thus oriented the reticles 42 vertically, the reticle transfer system 50 first rotates the rotary table 262 180° about the axis 264 and then rotates the tilt table 252 90° about the axis 254 until the rotary table 262 becomes oriented vertically and the reticles 42 become oriented horizontally.

INDUSTRIAL APPLICABILITY

Some IC fabs employ a practice of orienting all reticles 42 but one in a reticle carrier 144 in a particular direction. The remaining reticle 42 is then oriented in an opposite direction. The orientations chosen for the reticles 42 causes all layers of patterned material to face away from the inner surface of the walls of the reticle carrier 144. Such a mixed orientation for the reticles 42 reduces the possibility that the patterned layer might become contaminated by anything present on or in the walls of the reticle carrier 144. When exchanging reticles 42 which employ such an orientation in the reticle carrier 144 and a reticle cassette 36 or a reticle holder 132 present and exposed in one of the pod openers 52, the reticle transfer system 50 first places the rotary table 262 in either of the orientations depicted respectively in FIG. 18A or 18B. Having established one of these two orientations for the reticle carrier 144, the reticle transfer system 50 then effects an exchange of all properly oriented reticles 42 between the reticle carrier 144 and a reticle cassette 36 or a reticle holder 132 present and exposed in one of the pod openers 52. Those reticles 42 which are improperly oriented remain in the reticle carrier 144. After all the properly oriented reticles 42 have been exchanged, in the manner described above the reticle transfer system 50 effects a 180° C. of the rotary table 262 about the axis 264 into an orientation in which the remaining reticles 42 are properly oriented for an exchange between the reticle carrier 144 and a reticle cassette 36 or a reticle holder 132 present and exposed in one of the pod openers 52.

At any instant in time, large contract IC fabs, usually called foundries, may have an inventory of 3,000 to 6,000 different reticles 42. This large number of unique reticles 42 permit the foundry to manufacture a large number of different types of ICs, each different type of IC being manufactured in a quantity which responds to market demand therefor. However, maintaining order in such a large inventory of different reticles 42 is a herculean task. Thus a commercially available, conventional automated SMIF stocker not illustrated in any of the FIGs., such as the SMIF stocker disclosed in U.S. Pat. No. 5,980,183, may be advantageously combined with the reticle transfer system 50 for delivering SMIF pods 20 to the reticle transfer system 50 containing a specified reticle 42 or set of reticles 42, and for returning SMIF pods 20 containing reticles 42 from the reticle transfer system 50 to the inventory of reticles 42 maintained in the SMIF stocker.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A reticle transfer system that is adapted for transferring reticles used in integrated circuit ("IC") fabrication between reticle cassettes and/or reticle holders having differing configurations, each reticle cassette or reticle holder being respectively carried within a sealed Standard Mechanical InterFace ("SMIF") pod that is adapted for receiving and holding a reticle cassette or reticle holder having a particular configuration, each reticle cassette or reticle holder enclosed respectively within a sealed SMIF pod carrying at least one reticle, the SMIF pods including a cassette-type encoder formed by a block of material that is pierced by at least one hole to thereby establish a unique, machine-readable code for specifying a particular type of reticle cassette or reticle holder that the SMIF pod is adapted to receive and hold, the cassette-type encoder being affixed to a base of the SMIF pod, the reticle transfer system comprising:

a. at least two SMIF pod openers that are respectively adapted for:
  i. receiving a sealed SMIF pod which carries either a reticle cassette or a reticle holder; and
  ii. opening the SMIF pod thereby exposing either a reticle cassette or a reticle holder carried therein together with a reticle carried thereby to a controlled environment maintained within the reticle transfer system; and
 b. a robotic arm mechanism which includes an end effector that is adapted for supporting and clamping a reticle, the end effector including:
  i. a reticle-support blade that is secured to, supported by and projects outward from the robotic arm mechanism for effecting an automatic transfer of a reticle between a pair of reticle cassettes and/or reticle holders; and
  ii. a front gripper secured to an end of the reticle-support blade which is furthest from the robotic arm mechanism, and that the robotic arm mechanism, when effecting an automatic transfer of a reticle between a pair of reticle cassettes and/or reticle holders, disposes to receive an edge of the reticle that is located furthest from the robotic arm mechanism, and wherein the front gripper of the end effector is divided into two halves which are respectively secured to the end of the reticle-support blade on opposite sides of a notch that pierces the end of the reticle-support blade furthest from the robotic arm mechanism;

c. the robotic arm mechanism at various times being positionable within the reticle transfer system adjacent to an opened SMIF pod that is present within either of the pod openers for:
  i. inserting the end effector toward the exposed reticle cassette or reticle holder for supporting and clamping a reticle carried thereby, and to withdraw the reticle from the reticle cassette or reticle holder into the controlled environment maintained within the reticle transfer system; and
  ii. inserting the end effector having a reticle supported by and clamped thereto from the controlled environment maintained within the reticle transfer system toward the exposed reticle cassette or reticle holder to deposit the reticle in the reticle cassette or reticle holder;
whereby the reticle transfer system effects automatic transfer of reticles through the controlled environment maintained within the reticle transfer system between a pair of reticle cassettes and/or reticle holders; and
d. the end effector further including a thru-beam sensor which, when the reticle transfer system is ascertaining which particular type of reticle cassette or reticle holder the SMIF pod carries, passes a beam of light across the notch that pierces the end of the reticle-support blade furthest from the robotic arm mechanism when the robotic arm mechanism positions the end effector so the beam of light may pass through holes that pierce the block of material.

2. The reticle transfer system of claim 1 wherein the end effector further includes a rear gripper that is located on the reticle-support blade between the front gripper and the robotic arm mechanism, the rear gripper being urgeable horizontally along the reticle-support blade toward the front gripper to engage an edge of the reticle which is furthest from the front gripper when the end effector clamps a reticle thereto.

3. The reticle transfer system of claim 2 wherein the rear gripper of the end effector includes a vacuum port that is adapted for engaging the edge of the reticle which is furthest from the front gripper to form a vacuum chuck therewith which, during withdrawal of the reticle from the reticle cassette or reticle holder into the controlled environment maintained within the reticle transfer system, secures the reticle to the end effector.

4. The reticle transfer system of claim 1 wherein the end effector further includes a pair of moveable side grippers that are located on the reticle-support blade between the front gripper and the robotic arm mechanism, the side gripper being adapted for closing toward each other to respectively engage opposite side edges of the reticle thereby both clamping the reticle to the end effector and restraining the reticle from moving horizontally with respect to the reticle-support blade.

5. The reticle transfer system of claim 1 further comprising a reticle reorienter adapted for use in automatically exchanging reticles between a reticle carrier located in the reticle reorienter and a reticle cassette or a reticle holder located in one of the pod openers.

6. The reticle transfer system of claim 5 wherein the reticle reorienter further re-orients reticles between a vertical orientation of reticles present in a reticle carrier and a horizontal orientation of reticles carried either by a reticle cassette or by a reticle holder located in one of the pod openers.

7. The reticle transfer system of claim 6 wherein the reticle reorienter is a tilt station which is adapted for directly receiving the reticle carrier after removal from a reticle-shipping container, when the tilt station initially receives the reticle carrier reticles present therein are oriented vertically.

8. The reticle transfer system of claim 6 wherein the reticle reorienter is a box-opening station which is adapted for directly receiving a reticle-shipping container which includes an outer box in which rests a reticle carrier that receives reticles, the reticle carrier and reticles carried thereby being covered by a box cover which mates with and seals the outer box; when the box-opening station initially receives the reticle-shipping container, reticles present in the reticle carrier contained in the reticle-shipping container are oriented vertically; the box-opening station being further adapted for removing the box cover to thereby expose both the reticle carrier and reticles carried by the reticle carrier.

9. The reticle transfer system of claim 8 wherein a reticle-shipping container received by the box-opening station includes a registration tag for indicating the orientation of the reticle carrier enclosed therein, and the box-opening station includes an orientation probe for ascertaining the orientation of a reticle-shipping container received by the box-opening station.

10. The reticle transfer system of claim 8 wherein the box-opening station further includes least one box clamp for locking the outer box and the reticle carrier to the box-opening station while the box cover is removed therefrom.

11. The reticle transfer system of claim 8 wherein the box-opening station further includes a rotary table that receives a reticle-shipping container and is adapted for rotating the reticle-shipping container about an axis that is disposed parallel to reticles carried in the reticle carrier enclosed within the reticle-shipping container.

12. The reticle transfer system of claim 1 wherein the end effector includes a reticle-presence detector that is adapted for use in ascertaining a location where the reticle cassette or reticle holder actually carries a reticle.

13. A reticle transfer system that is adapted for transferring reticles used in IC fabrication between reticle cassettes and/or reticle holders having differing configurations, each reticle cassette or reticle holder being respectively carried within a sealed SMIF pod that is adapted for receiving and holding a reticle cassette or reticle holder having a particular configuration, each reticle cassette or reticle holder enclosed respectively within a sealed SMIF pod carrying at least one reticle, the reticle transfer system comprising:
  a. at least two SMIF pod openers that are respectively adapted for:
    i. receiving a sealed SMIF pod which carries either a reticle cassette or a reticle holder;
    ii. opening the SMIF pod thereby exposing either a reticle cassette or a reticle holder carried therein together with a reticle carried thereby to a controlled environment maintained within the reticle transfer system;
  b. a robotic arm mechanism which includes an end effector that is adapted for supporting and clamping a reticle, the robotic arm mechanism at various times being positionable within the reticle transfer system adjacent to an opened SMIF pod that is present within either of the pod openers and:
    i. for inserting the end effector toward the exposed reticle cassette or reticle holder for supporting and clamping a reticle carried thereby, and to withdraw the reticle from the reticle cassette or reticle holder into the controlled environment maintained within the reticle transfer system; and ii. for inserting the end effector having a reticle supported by and clamped thereto from the controlled environment maintained within the reticle transfer system toward the exposed reticle cassette or reticle holder to deposit the reticle in the reticle cassette or reticle holder;

whereby the reticle transfer system effects automatic transfer of reticles through the controlled environment maintained within the reticle transfer system between a pair of reticle cassettes and/or reticle holders; and c. a box-opening-station reticle reorienter that is adapted for:
  i. use in automatically exchanging reticles between a reticle carrier located in the reticle reorienter and a reticle cassette or a reticle holder located in one of the pod openers; and
  ii. receiving in the box-opening-station reticle reorienter a reticle-shipping container having:
    A. a reticle carrier enclosed therein; and
    B. a registration tag for indicating an orientation for the reticle carrier enclosed therein; and
  iii. the box-opening-station reticle reorienter including an orientation probe for use in ascertaining the orientation of a reticle-shipping container received therein.

14. The SMIF pods, which pod openers included in the reticle transfer system of claim 13 are adapted to receive, include a cassette-type encoder which carries a unique, machine-readable code for specifying a particular type of reticle cassette or reticle holder that the SMIF pod is adapted to receive and hold,
  the reticle transfer system of claim 20 further comprising a reader for ascertaining from the cassette-type encoder which particular type of reticle cassette or reticle holder a SMIF pod carries.

15. Each cassette-type encoder included in SMIF pods, which pod openers included in the reticle transfer system of claim 14 are adapted to receive, include a block of material that is pierced by at least one hole and which is affixed to a base of the SMIF pod, and wherein
  the end effector of the reticle transfer system of claim 21 includes a thru-beam sensor which, in ascertaining which particular type of reticle cassette or reticle holder the SMIF pod carries, is adapted for passing a beam of light through holes that pierce the block of material.

16. The ret ide transfer system of claim 13 wherein the end effector includes a reticle-presence detector that is adapted for use in ascertaining a location where the reticle cassette or reticle holder actually carries a reticle.

17. The reticle transfer system of claim 13 wherein the end effector includes:
  a reticle-support blade that is secured to, supported by and projects outward from the robotic arm mechanism, and that the robotic arm mechanism, when effecting an automatic transfer of a reticle between a pair of reticle cassettes and/or reticle holders, disposes beneath the reticle; and
  a front gripper secured to an end of the reticle-support blade which is furthest from the robotic arm mechanism, and that the robotic arm mechanism, when effecting an automatic transfer of a reticle between a pair of reticle cassettes and/or reticle holders, disposes to receive an edge of the reticle that is located furthest from the robotic arm mechanism.

18. The SMIF pods, which pod openers included in the reticle transfer system of claim 17 are adapted to receive, include a cassette-type encoder formed by a block of material that is pierced by at least one hole to thereby establish a unique, machine-readable code for specifying a particular type of reticle cassette or reticle holder that the SMIF pod is adapted to receive and hold, the cassette-type encoder being affixed to a base of the SMIF pod, and wherein
  the reticle transfer system of claim 17
    wherein the front gripper of the end effector is divided into two halves which are respectively secured to the end of the reticle-support blade on opposite sides of a notch that pierces the end of the reticle-support blade furthest from the robotic arm mechanism; and
    the end effector further includes a thru-beam sensor which, when the reticle transfer system ascertains which particular type of reticle cassette or reticle holder the SMIF pod carries:
      passes a beam of light across the notch that pierces the end of the reticle-support blade furthest from the robotic arm mechanism; and
      the robotic arm mechanism positions the end effector so the beam of light may pass through holes that pierce the block of material.

19. The reticle transfer system of claim 17 wherein the end effector further includes a rear gripper that is located on the reticle-support blade between the front gripper and the robotic arm mechanism, the rear gripper being urgeable horizontally along the reticle-support blade toward the front gripper to engage an edge of the reticle which is furthest from the front gripper when the end effector clamps a reticle thereto.

20. The reticle transfer system of claim 19 wherein the rear gripper of the end effector includes a vacuum port that is adapted for engaging the edge of the reticle which is furthest from the front gripper to form a vacuum chuck therewith which, during withdrawal of the reticle from the reticle cassette or reticle holder into the controlled environment maintained within the reticle transfer system, secures the reticle to the end effector.

21. The reticle transfer system of claim 17 wherein the end effector further includes a pair of moveable side grippers that are located on the reticle-support blade between the front gripper and the robotic arm mechanism, the side gripper being adapted for closing toward each other to respectively engage opposite side edges of the reticle thereby both clamping the reticle to the end effector and restraining the reticle from moving horizontally with respect to the reticle-support blade.

22. The reticle transfer system of claim 13 wherein the reticle reorienter further re-orients reticles between a vertical orientation of reticles present in a reticle carrier and a horizontal orientation of reticles carried either by a reticle cassette or by a reticle holder located in one of the pod openers.

23. The reticle transfer system of claim 22 wherein the reticle reorienter provides a tilt station which is adapted for directly receiving the reticle carrier after removal from a reticle-shipping container, the tilt station initially receiving the reticle carrier with reticles present therein oriented vertically.

24. The reticle transfer system of claim 13 wherein the box-opening-station reticle reorienter is adapted for directly receiving a reticle-shipping container which includes an outer box in which rests a reticle carrier that receives reticles, the reticle carrier and reticles carried thereby being covered by a box cover which mates with and seals the outer box; the box-opening station being further adapted for removing the box cover to thereby expose both the reticle carrier and reticles carried therein.

25. The reticle transfer system of claim 24 wherein the box-opening station further includes least one box clamp for locking the outer box and the reticle carrier to the box-opening station while the box cover is removed therefrom.

26. The reticle transfer system of claim 24 wherein the box-opening station further includes a rotary table that receives a reticle-shipping container and is adapted for rotating the reticle-shipping container about an axis that is disposed parallel to reticles carried in the reticle carrier enclosed within the reticle-shipping container.

* * * * *